(12) United States Patent
Chen et al.

(10) Patent No.: US 11,832,520 B2
(45) Date of Patent: Nov. 28, 2023

(54) VOLTAGE BREAKDOWN UNIFORMITY IN PIEZOELECTRIC STRUCTURE FOR PIEZOELECTRIC DEVICES

(71) Applicant: Taiwan Semiconductor Manufacturing Co., Ltd., Hsin-Chu (TW)

(72) Inventors: Chih-Ming Chen, Hsinchu (TW); Chiao-Chun Hsu, Hsin-Chu (TW); Chung-Yi Yu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 100 days.

(21) Appl. No.: 17/241,620

(22) Filed: Apr. 27, 2021

(65) Prior Publication Data

US 2022/0344575 A1 Oct. 27, 2022

(51) Int. Cl.
*H10N 30/053* (2023.01)
*C23C 16/458* (2006.01)
(Continued)

(52) U.S. Cl.
CPC ....... *H10N 30/053* (2023.02); *C23C 16/4588* (2013.01); *C23C 16/46* (2013.01); *H10N 30/067* (2023.02); *H10N 30/078* (2023.02)

(58) Field of Classification Search
CPC .. H10N 30/053; H10N 30/078; H10N 30/067; C23C 16/4588; C23C 16/46
See application file for complete search history.

(56) References Cited

U.S. PATENT DOCUMENTS 6,730,522 B1 5/2004 Nakamura et al.
2012/0025667 A1\* 2/2012 Horikiri ................. H05K 3/108
310/314
(Continued)

FOREIGN PATENT DOCUMENTS

EP 2363903 A2 \* 9/2011 ............. B05D 3/007
EP 2518180 A2 \* 10/2012 ....... C23C 16/45572
(Continued)

OTHER PUBLICATIONS

Shoghi et al. "Synthesis of Crack-Free PZT Thin Films by Sol-gel Processing on Glass Substrate." Procedia Materials Science 11 ( 2015 ) 386-390, published in 2015.
(Continued)

*Primary Examiner* — Jeffrey T Carley
(74) *Attorney, Agent, or Firm* — Eschweiler & Potashnik, LLC

(57) ABSTRACT

In some embodiments, the present disclosure relates to a processing tool that includes a wafer chuck disposed within a hot plate chamber and having an upper surface configured to hold a semiconductor wafer. A heating element is disposed within the wafer chuck and configured to increase a temperature of the wafer chuck. A motor is coupled to the wafer chuck and configured to rotate the wafer chuck around an axis of rotation extending through the upper surface of the wafer chuck. The processing tool further includes control circuitry coupled to the motor and configured to operate the motor to rotate the wafer chuck while the temperature of the wafer chuck is increased to form a piezoelectric layer from a sol-gel solution layer on the semiconductor wafer.

20 Claims, 24 Drawing Sheets

(51) Int. Cl.
  *C23C 16/46* (2006.01)
  *H10N 30/067* (2023.01)
  *H10N 30/078* (2023.01)

(56) References Cited

U.S. PATENT DOCUMENTS

| | | | |
|---|---|---|---|
| 2012/0056508 A1* | 3/2012 | Horikiri | H10N 30/8542 |
| | | | 310/317 |
| 2012/0171364 A1* | 7/2012 | Haider | H01L 21/02186 |
| | | | 427/444 |
| 2015/0270475 A1* | 9/2015 | Isshiki | B41J 2/1628 |
| | | | 310/360 |
| 2015/0311426 A1* | 10/2015 | Tseng | H10N 30/081 |
| | | | 427/532 |
| 2017/0072691 A1 | 3/2017 | Hays et al. | |
| 2018/0355480 A1* | 12/2018 | Kondo | H01J 37/32724 |
| 2020/0131641 A1 | 4/2020 | Hsu et al. | |
| 2022/0260917 A1* | 8/2022 | Buchberger, Jr. | G03F 7/38 |

FOREIGN PATENT DOCUMENTS

| | | | | |
|---|---|---|---|---|
| JP | 2001298222 A | * | 10/2001 | |
| JP | 2013059956 A | * | 4/2013 | |
| WO | WO-2010032708 A1 | * | 3/2010 | C23C 16/46 |
| WO | WO-2018003372 A1 | * | 1/2018 | C23C 16/0209 |

OTHER PUBLICATIONS

Marvell Nanofabrication Laboratory. "SOL-gel PZT." Published on Jan. 23, 2015.
Piezo Blog. "Piezotechnology: Fundamentals of Piezoelectricity." Published in 2012.
ScienceDirect Topics."Sol-Gel." Corrosion Protection and Control Using Nanomaterials, published in 2012.
Ng, Zi Neng. "Sol-gel Spin Coating Process."
Rorze Technology Inc. "Aligner—RA320." Published in 2017.
Rorze Technology Inc. "Robot." Published in 2017.
Rorze Technology Inc. "Robot—Vacuum Handling Robots." Published in 2017.
Wikipedia.org "Actuator." Published on Jun. 9, 2020.
Wikipedia.org "Piezoelectricity." Published on Jun. 1, 2020.
Wikipedia.org. "Sol-gel Process." Published on Apr. 9, 2020.

* cited by examiner

VOLTAGE BREAKDOWN UNIFORMITY IN PIEZOELECTRIC STRUCTURE FOR PIEZOELECTRIC DEVICES

BACKGROUND

Piezoelectric devices (e.g., piezoelectric actuators, piezoelectric sensors, etc.) are used in many modern day electronic devices (e.g., automotive sensors/actuators, aerospace sensors/actuators, etc.). One example of a piezoelectric device is a piezoelectric actuator. A piezoelectric actuator can be utilized to create a physical movement that exerts a force on a physical part in a system under the control of an electrical signal. The physical movement generated by the piezoelectric actuator can be utilized to control various kinds of systems (e.g., mechanical systems, optical systems, etc.).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
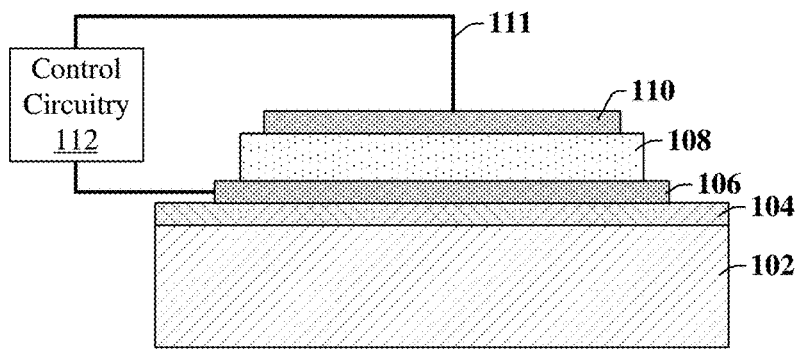
FIG. 1 illustrates a cross-sectional view of some embodiments of piezoelectric device comprising a piezoelectric structure formed to have a substantially uniform breakdown voltage throughout the piezoelectric structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A piezoelectric device is a metal-insulator-metal (MIM) device that includes a piezoelectric structure arranged between top and bottom electrodes. When a sufficient voltage bias is applied across the top and bottom electrodes, a mechanical strain may be induced in the piezoelectric structure. The mechanical strain may, for example, be used in acoustical, mechanical, and/or optical applications. The change in the structure of the piezoelectric layer may affect other electronic properties in the piezoelectric structure such as permittivity, capacitance, and polarization. The change in structure of the piezoelectric structure is a reversible process when the voltage biases applied to the piezoelectric structure are less than a breakdown voltage of the piezoelectric layer. If a voltage bias greater than or equal to the breakdown voltage of the piezoelectric structure is applied to the piezoelectric layer, the mechanical strain induced in the piezoelectric layer is irreversible, and thus, the piezoelectric structure is damaged causing the piezoelectric device to be unreliable.

In some methods of manufacturing a piezoelectric device, a bottom electrode may be formed over a wafer; a piezoelectric structure may be formed over the bottom electrode; and a top electrode may be formed over the piezoelectric structure. Then, a dicing process may be performed along die regions on the wafer to form many piezoelectric devices from the wafer. In some embodiments, a sol-gel process is used to form the piezoelectric structure on the wafer. The sol-gel process may include a spin-coat step, wherein a sol-gel solution layer is formed over the wafer and a baking process, wherein drying, decomposition, and densification occur to form a solid, piezoelectric structure from the sol-gel solution layer. However, in some embodiments, the removal of gases during the baking process is not uniform throughout the piezoelectric structure, leading to varying piezoelectric compositions throughout the piezoelectric structure, and ultimately leading to a wide range of breakdown voltages throughout the piezoelectric structure on the wafer. For example, in some embodiments, a first piezoelectric device and a second piezoelectric device coming from a same wafer as the first piezoelectric device may have a difference in breakdown voltage from one another of up to 20 volts. As a result, the piezoelectric devices formed from a same sol-gel process do not have predictable properties (e.g., breakdown voltage, composition, etc.).

Various embodiments of the present disclosure relate to rotating the wafer to be at different orientations within a hot plate chamber during the baking process to increase the uniformity of the baking process throughout the piezoelectric structure to reduce a variation in composition throughout the piezoelectric structure and thus, to reduce the range of breakdown voltages in the final piezoelectric devices formed from the piezoelectric structure. For example, in some embodiments, rotating the wafer to be at different orientations within the hot plate chamber during the baking process may reduce the range of breakdown voltages of the final piezoelectric devices by 50 percent. In some embodiments of the present disclosure, rotation of the wafer may be achieved by rotating the wafer between different cycles of the baking process using an orientor device, whereas in other embodiments of the present disclosure, the rotation of the wafer may be achieved by continuously rotating the wafer within the hot plate chamber during the baking process using a rotatable wafer chuck or hot plate. As a result, the sol-gel process that includes performing a baking process at different orientations in the hot plate chamber produces a piezoelectric structure with a more uniform breakdown voltage distribution throughout the piezoelectric structure, thereby increasing reliability of the resulting piezoelectric devices.

FIG. 1 illustrates a cross-sectional view 100 of some embodiments of a piezoelectric device coupled to control circuitry.

The piezoelectric device in the cross-sectional view 100 may comprise, in some embodiments, a bottom electrode 106 arranged over a substrate 102. A piezoelectric structure 108 may be arranged over the bottom electrode 106 and beneath a top electrode 110. In some embodiments, a passivation layer 104 may be arranged directly between the substrate 102 and the bottom electrode 106. In some embodiments, the bottom electrode 106 may be wider than the top electrode 110 and the piezoelectric structure 108. In some embodiments, the piezoelectric structure 108 may be wider than the top electrode 110. In yet other embodiments, outer sidewalls of the top electrode 110, the piezoelectric structure 108, and/or the bottom electrode 106 may be substantially aligned with one another. In some embodiments, the piezoelectric structure 108 may comprise multiple layers of a same piezoelectric material. In some embodiments, the piezoelectric structure 108 may comprise, for example, a piezoelectric ceramic material such as lead zirconate titanate, which comprises lead, zirconium, titanium, and oxygen. In some other embodiments, the piezoelectric structure 108 may comprise, for example, aluminum nitride, lithium niobate, gallium arsenide, zinc oxide, quartz single crystals, polymer-film piezoelectrics, or some other suitable piezoelectric material. In some embodiments, the piezoelectric structure 108 may have a thickness in a range of between, for example, approximately 2,000 angstroms and approximately 30,000 angstroms.

In some embodiments, control circuitry 112 may be coupled to the top and bottom electrodes 110, 106 through wires 111. In some embodiments, electrical contacts such as solder bumps or bond pads (not shown) couple the wires 111 directly to the top and bottom electrodes 110, 106. In some embodiments, the control circuitry 112 is configured to apply voltage biases across the piezoelectric structure 108. In some embodiments, to prevent irreversible damage to the piezoelectric structure 108, the control circuitry 112 is configured to apply voltage biases that are less than a breakdown voltage of the piezoelectric structure 108. Thus, by knowing the breakdown voltage of the piezoelectric structure 108, the control circuitry 112 can prevent damage to the piezoelectric device.

In some embodiments, the piezoelectric structure 108 is formed over an entire wafer using a sol-gel process. In such embodiments, the wafer is then diced to form the piezoelectric device in the cross-sectional view 100. In such embodiments, the piezoelectric structure 108 may be formed over the wafer to have a reduced variation in composition throughout the piezoelectric structure 108 by rotating the wafer during a baking process of a sol-gel method. This way, the piezoelectric structure 108 may undergo a more uniform baking process, and differences between breakdown voltages amongst the resulting piezoelectric devices are reduced.

Figure 2:
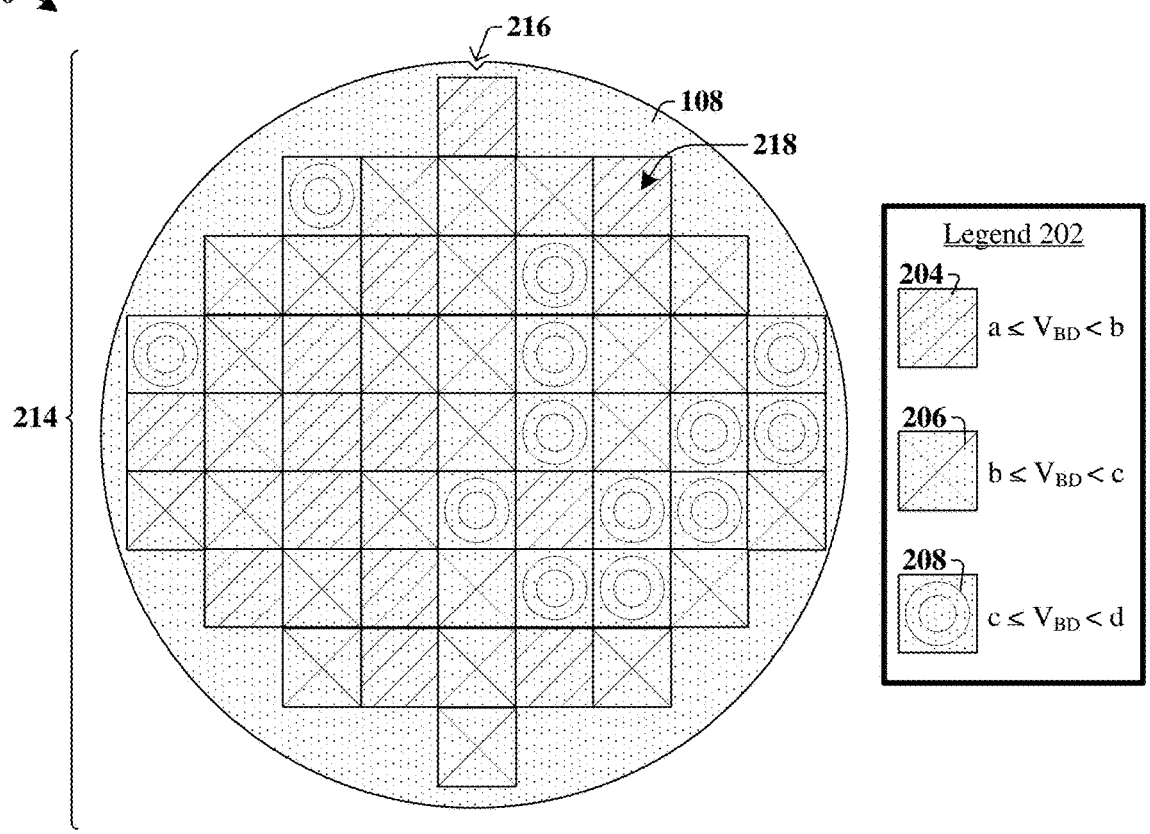
FIG. 2 illustrates a top-view of some embodiments of a wafer comprising multiple die regions, wherein each die comprises a piezoelectric structure having a certain breakdown voltage.

FIG. 2 illustrates a top-view 200 of some embodiments of a piezoelectric structure arranged over a wafer and breakdown voltages of the piezoelectric structure of each die region on the wafer. The top-view 200 of FIG. 2 will be discussed below in conjunction with the cross-sectional view 100 of FIG. 1.

In some embodiments, multiple die regions 218 are arranged on a wafer 214, and a dicing process that utilizes a rotating blade and/or water will separate each die region 218 to form a piezoelectric device illustrated in FIG. 1. Thus, multiple piezoelectric devices may be formed on a single wafer 214 to increase manufacturing efficiency.

The top-view 200 of FIG. 2 illustrates the piezoelectric structure 108 arranged over the wafer 214. The substrate 102 of FIG. 1 corresponds to a portion of the wafer 214. In some embodiments, the bottom electrode 106 and the passivation layer 104 may be arranged behind the piezoelectric structure 108 in FIG. 2. Further, in some embodiments, the top electrode 110 may be formed over the piezoelectric structure 108 prior to performing a dicing process.

In some embodiments, each die region 218 that corresponds to a piezoelectric device has a breakdown voltage that corresponds to a low breakdown voltage 204, a mid-breakdown voltage 206, or a high breakdown voltage 208 as indicated by a diagonal-stripe pattern, a cross pattern, or a concentric-circle pattern, respectively. For example, in some embodiments, according to a legend 202 in FIG. 2, die regions 218 having the low breakdown voltage 204 have a breakdown voltage in a range of between a and b; die regions 218 having the mid-breakdown voltage 206 have a breakdown voltage in a range of between b and c; and die regions 218 having the high breakdown voltage 208 have a breakdown voltage in a range of between c and d. In such embodiments, a may be equal to a minimum breakdown voltage of the piezoelectric structure 108, and d may be equal to a maximum breakdown voltage of the piezoelectric structure 108. In some embodiments, the minimum breakdown voltage of the piezoelectric structure 108, or a, may be in a range of between, for example, approximately 60 volts and approximately 62 volts. In some embodiments, the maximum breakdown voltage of the piezoelectric structure 108, or d, may be in a range of between, for example, approximately 68 volts and approximately 70 volts. In some other embodiments, the maximum breakdown voltage of the piezoelectric structure 108, or d, may be greater than 80 volts, for example.

Thus, in some embodiments, an overall variation in the breakdown voltages throughout the piezoelectric structure 108 on the wafer 214 may be quantified by a range of between a and d. In some embodiments, the difference between a and d is in a range of between, for example approximately 1 volt and approximately 8 volts. In some other embodiments, the difference between a and d is in a range of between, for example, approximately 8 volts and approximately 10 volts. The reliability of the piezoelectric structure 108 may be increased by reducing the range between a and d such that the piezoelectric structure 108 may be formed with a more uniform, and thus, predictable breakdown voltage for each die region 218. This way, each piezoelectric device has a known breakdown voltage such that the control circuitry 112 does not apply a voltage bias across the piezoelectric structure 108 in a piezoelectric device that exceeds the known breakdown voltage and irreversibly damage the piezoelectric structure 108.

In some embodiments, reducing the range between a and d for the breakdown voltage of the piezoelectric structure 108 is achieved by rotating the wafer 214 during the baking process of a sol-gel process used to form the piezoelectric structure 108. In some embodiments, the orientation of the wafer 214 is determined by identifying a notch 216 in the wafer 214. Then, in such embodiments, an orientor device can rotate the wafer 214 such that the notch 216 is in a first predetermined position with respect to a hot plate chamber during a first cycle of the baking process. In such embodiments, after the first cycle of the baking process, the orientor device may rotate the wafer 214 by a predetermined amount of degrees to a second predetermined position, and then, a second cycle of the baking process may be performed. In such embodiments, the number of cycles of the baking process may correspond to 360 degrees divided by the predetermined amount of degrees. For example, in some embodiments, the predetermined amount of degrees is equal to 90 degrees, and thus, the baking process comprises four cycles.

Figure 3:
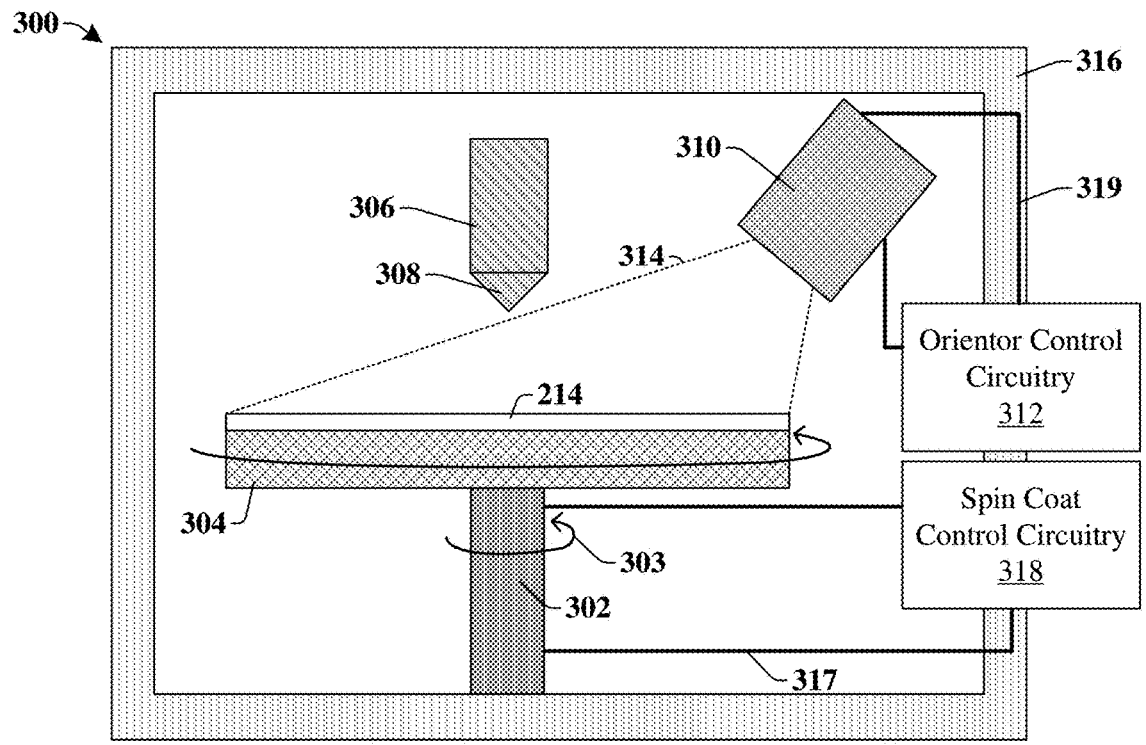
FIG. 3 illustrates a cross-sectional view of some embodiments of a spin-coat tool comprising an orientor device used to form a piezoelectric structure with a small variation in breakdown voltage.

FIG. 3 illustrates a cross-sectional view 300 of some embodiments of a spin-coat tool for a sol-gel process and comprising an orientor device.

In some embodiments, a spin-coat tool housing 316 defines the spin-coat tool. In some embodiments, a rotatable shaft 302 is arranged on the bottom of the spin-coat tool housing 316, and a wafer chuck 304 is coupled to a top of the rotatable shaft 302. In such embodiments, the wafer chuck 304 may be configured to hold a wafer 214. In some embodiments, the spin-coat tool further comprises a solution housing 306 and nozzle 308 used to deposit a sol-gel solution onto the wafer 214 during a spin-coating step of a sol-gel process. In some embodiments, the solution housing 306 and nozzle 308 are arranged directly over the wafer chuck 304. In other embodiments, some other sol-gel solution distribution apparatus may be used instead of the solution housing 306 and the nozzle 308, such as a cup, a syringe, or the like.

In some embodiments, the rotatable shaft 302 and/or the solution housing 306 and nozzle 308 are controlled by spin coat control circuitry 318. The spin coat control circuitry 318 is arranged within the spin-coat tool housing 316 in some embodiments, whereas in other embodiments, the spin coat control circuitry 318 may be arranged outside of the spin-coat tool housing 316. In some embodiments, the spin coat control circuitry 318 is directly coupled to the rotatable shaft 302 and/or the solution housing 306 and nozzle 308 through wires 317, whereas in other embodiments, the spin coat control circuitry 318 is coupled to the rotatable shaft 302 and/or the solution housing 306 and nozzle 308 wirelessly. Nevertheless, in some embodiments, the spin coat control circuitry 318 is configured to rotate 303 the rotatable shaft 302 to evenly distribute a sol-gel solution (not shown) onto the wafer 214. Thus, after the spin-coat process, the sol-gel solution is arranged over the wafer 214 as a layer with a substantially uniform thickness.

In some embodiments, the spin-coat tool further comprises an orientor device 310. In some embodiments, the orientor device 310 is arranged within the spin-coat tool housing 316. In such embodiments, the orientor device 310 may comprise some type of optical image device such as, for example, a charge-coupled device (CCD) image sensor, a complementary metal oxide semiconductor (CMOS) image sensor, a time of flight (ToF) camera, or some other optical image device. In some embodiments, the orientor device 310 may be configured to use the optical image device to locate the notch (216 of FIG. 2) on the wafer 214 after the sol-gel solution is distributed on the wafer 214. Thus, in some embodiments, the orientor device 310 may be configured to optically analyze an entire area of the wafer 214, as illustrated by dotted lines 314. In some embodiments, the orientor device 310 is coupled to orientor control circuitry 312. The orientor control circuitry 312 is arranged within the spin-coat tool housing 316 in some embodiments, whereas in other embodiments, the orientor control circuitry 312 may be arranged outside of the spin-coat tool housing 316. In some embodiments, the orientor control circuitry 312 is directly coupled to the orientor device 310 through wires 319, whereas in other embodiments, the orientor control circuitry 312 may be coupled to the orientor device 310 wirelessly. Nevertheless, in some embodiments, the orientor control circuitry 312 may turn the orientor device 310 "ON" after the spin coat control circuitry 318 is turned "OFF" to locate the notch (216 of FIG. 2) on the wafer 214 after the sol-gel solution has been deposited on the wafer 214.

In some embodiments, the orientor device 310 further comprises an alignment device that is configured to orient the wafer 214 such that the notch (216 of FIG. 2) is arranged at a specific location on the wafer chuck 304. In such embodiments, the alignment device of the orientor device 310 may be or comprise a rotational feature on the wafer chuck 304, a robotic arm, or some other apparatus configured to move the wafer 214. In other embodiments, the alignment device of the orientor device 310 may be arranged outside of the spin-coat tool housing 316. In some embodiments, the orientor device 310 may be also be known as a wafer alignment system. Overall, the orientor device 310 may be configured to transport the wafer 214 at a certain orientation according to the notch (216 of FIG. 2) location into the next processing chamber of the sol-gel process.

Figure 4:
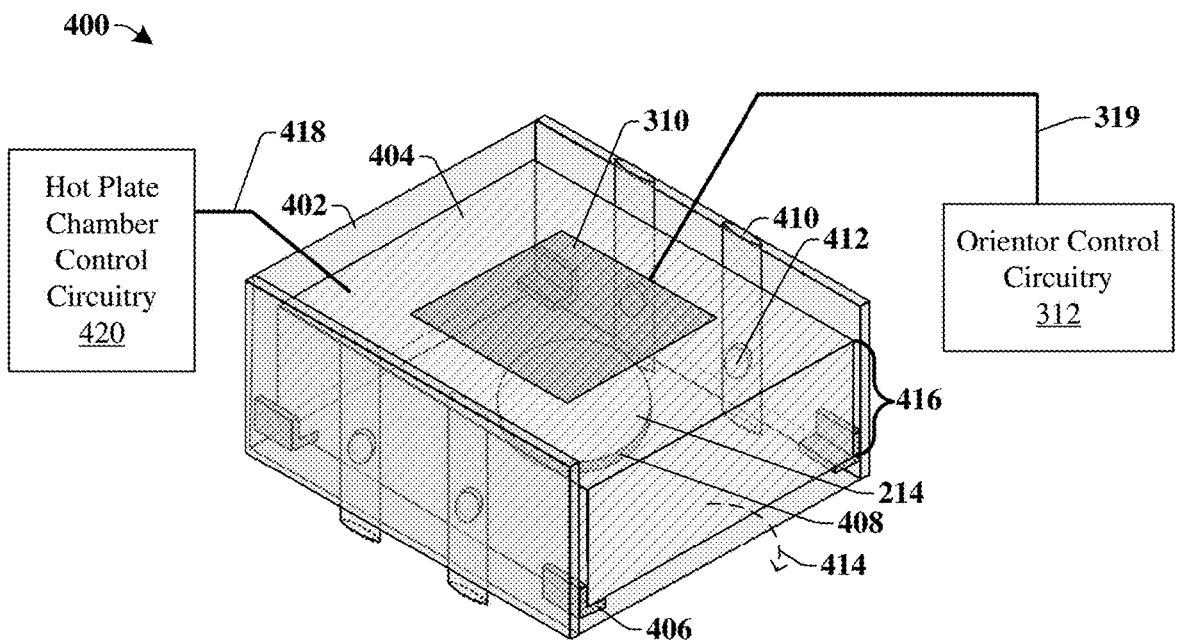
FIG. 4 illustrates a perspective view of some embodiments of a hot plate chamber comprising an orientor device used to form a piezoelectric structure with a small variation in breakdown voltage.

FIG. 4 illustrates a perspective view 400 of some embodiments of a hot plate chamber for a sol-gel process and comprising an orientor device.

In some embodiments, a hot plate chamber 404 defined by hot plate chamber housing is used in a sol-gel process and configured to perform a baking process on a sol-gel solution layer. The baking process may comprise multiple cycles and/or temperature conditions to dry, decompose, and densify the sol-gel solution layer to form a solid layer over the wafer 214. In some embodiments, the hot plate chamber 404 is arranged in a structural housing 402 and held in the structural housing 402 by hot plate holder structures 406. A hot plate 408 is arranged on a bottom of the hot plate chamber 404, and in some embodiments, the hot plate chamber 404 may be opened 414 using a door 416 to load a wafer 214 onto the hot plate 408. In some embodiments, the hot plate 408 comprises a wafer chuck configured to hold the wafer 214 at an upper surface of the wafer chuck and a heating element configured to increase a temperature of the wafer chuck.

The hot plate 408 is configured to provide heat in the hot plate chamber 404 to facilitate the baking process. The hot plate 408 may be controlled by hot plate chamber control circuitry 420. The hot plate chamber control circuitry 420 is arranged within the hot plate chamber 404 in some embodiments, whereas in other embodiments, the hot plate chamber control circuitry 420 may be arranged outside of the hot plate chamber 404. In some embodiments, the hot plate chamber control circuitry 420 is directly coupled to the hot plate chamber 404 and/or hot plate 408 through wires 418, whereas in other embodiments, the hot plate chamber control circuitry 420 may be coupled to the hot plate chamber 404 and/or the hot plate 408 wirelessly. The hot plate chamber control circuitry 420 may, in some embodiments, be configured to control the temperature settings, door 416, and/or other parameters of the hot plate chamber 404.

In some embodiments, during the baking process, gases are released from the sol-gel solution layer on the wafer 214. Thus, in some embodiments, the hot plate chamber 404 may comprise gas pore openings 412, wherein the gas pore openings 412 extend through the hot plate chamber 404 and are coupled to gas exhaust lines 410. Thus, in some embodiments, the gases, such as, for example, carbon dioxide, water vapor, oxygen, or the like, released during the baking process may exit the hot plate chamber 404 through the gas pore openings 412 and the gas exhaust lines 410. In some embodiments, the gas exhaust lines 410 may be fixed to the structural housing 402. Further, in some embodiments, there may be more or less than four gas pore openings 412 arranged within the hot plate chamber 404. In some embodiments, the gas pore openings 412 do not completely surround the hot plate 408. For example, in some embodiments, the gas pore openings 412 may not be arranged on the door 416 of the hot plate chamber 404. In such embodiments, the rate of removal of gases through the gas pore openings 412 from certain areas of the wafer 214 may be quicker than other areas of the wafer 214.

Therefore, in some embodiments, to more evenly remove gases during the baking process and result in a more uniform composition throughout the solid layer that is formed on the wafer 214, the hot plate chamber 404 may further comprise the orientor device 310 coupled to orientor control circuitry 312. In some embodiments, the orientor device 310 may be arranged near a top of the hot plate chamber 404. In such embodiments, the orientor device 310 may comprise an optical imaging device and an alignment device in order to rotate the wafer 214 to be at different orientations with respect to the hot plate chamber 404 throughout the baking process. In some embodiments, for example, the optical image device (e.g., CCD image sensor, CMOS image sensor, ToF camera, etc.) of the orientor device 310 may be configured to locate the notch (216 of FIG. 2) on the wafer 214, and the alignment device (e.g., rotational feature, robotic arm, etc.) of the orientor device 310 may be configured to move the wafer 214 such that the notch (216 of FIG. 2) is located at a predetermined position within the hot plate chamber 404 on the hot plate 408. For example, in some embodiments, a first cycle of the baking process is performed while the wafer 214 is at a first predetermined position in the hot plate chamber 404; a second cycle of the baking process is performed while the wafer 214 is at a second predetermined position in the hot plate chamber 404; a third cycle of the baking process is performed while the wafer 214 is at a third predetermined position in the hot plate chamber 404; and a fourth cycle of the baking process is performed while the wafer 214 is at a fourth predetermined position in the hot plate chamber 404.

Thus, as the wafer is moved or rotated between cycles of the baking process, the removal of gases through the gas pore openings 412 may be more uniform throughout all areas of the wafer 214. As a result, the solid layer (e.g., the piezoelectric structure 108 of FIG. 1) formed from the sol-gel solution layer may have a more uniform composition and thus, a smaller variation in properties (e.g., breakdown voltage) throughout the solid layer (e.g., the piezoelectric structure 108 of FIG. 1).

Figure 5:
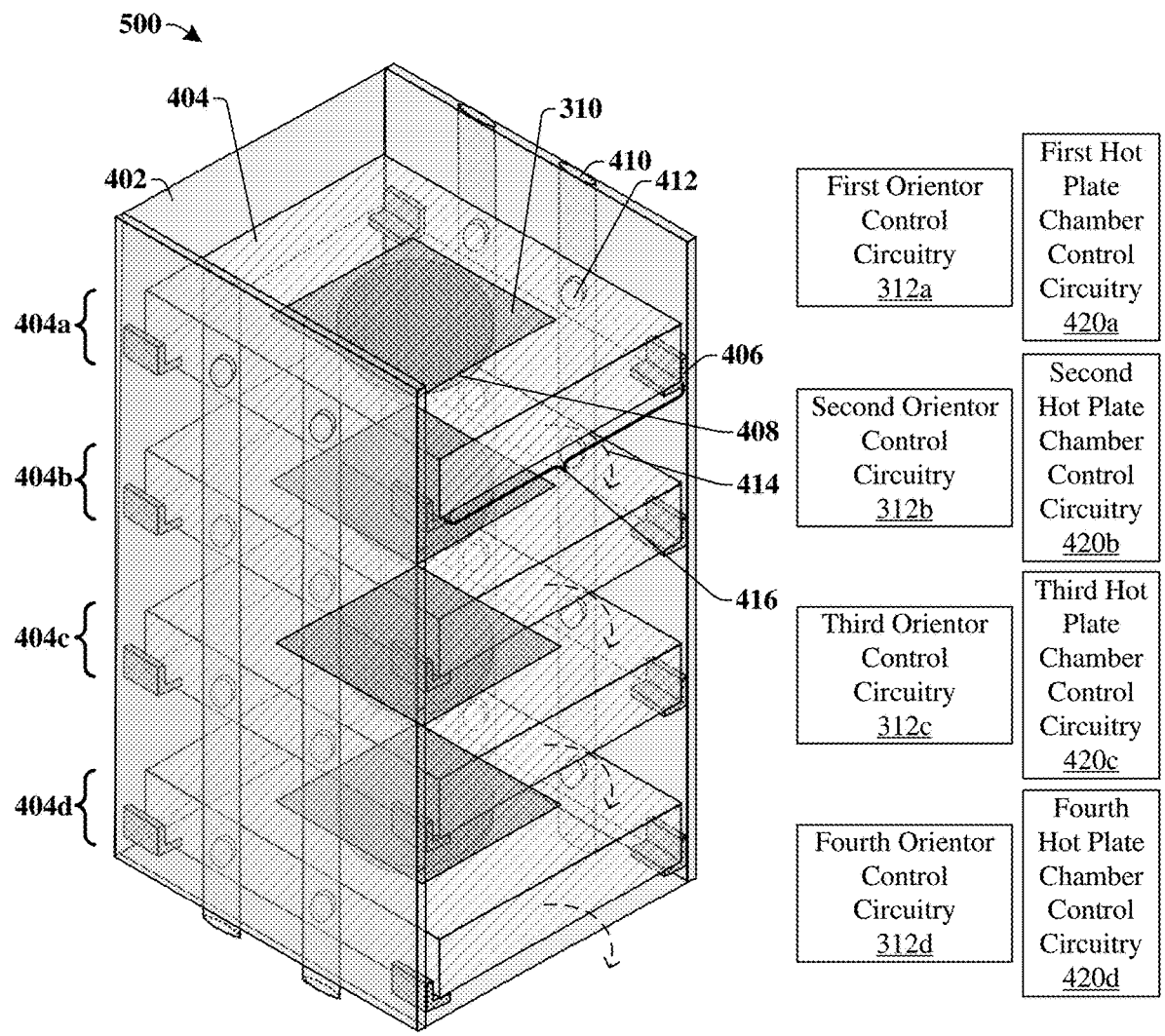
FIG. 5 illustrates a perspective view of some embodiments of multiple hot plate chambers in a hot plate tool, wherein each hot plate chamber comprises an orientor device used to form a piezoelectric structure with a small variation in breakdown voltage.

FIG. 5 illustrates a perspective view 500 of some embodiments of multiple hot plate chambers comprising orientor devices that are vertically stacked to increase manufacturing efficiency.

The perspective view 500 includes a first hot plate chamber 404a, a second hot plate chamber 404b, a third hot plate chamber 404c, and a fourth hot plate chamber 404d vertically arranged in the structural housing 402. Thus, multiple wafers (214 of FIG. 4) may be simultaneously processed, thereby increasing the manufacturing efficiency. In such embodiments, each of the first through fourth hot plate chambers 404a-d may comprise an orientor device 310. Further, in some embodiments, each of the first through fourth hot plate chamber 404a-d and each orientor device 310 within each of the first through fourth hot plate chambers 410a-d may comprise its own control circuitry. For example, in some embodiments, the first hot plate chamber 404a and the orientor device 310 of the first hot plate chamber 404a may be coupled to first hot plate chamber control circuitry 420a and first orientor control circuitry 312a, respectively; the second hot plate chamber 404b and the orientor device 310 of the second hot plate chamber 404b may be coupled to second hot plate chamber control circuitry 420b and second orientor control circuitry 312b, respectively; the third hot plate chamber 404c and the orientor device 310 of the third hot plate chamber 404c may be coupled to third hot plate chamber control circuitry 420c third orientor control circuitry 312c, respectively; and the fourth hot plate chamber 404d and the orientor device 310 of the fourth hot plate chamber 404d may be coupled to fourth hot plate chamber control circuitry 420d and fourth orientor control circuitry 312d, respectively. In other embodiments, the first through fourth hot plate chambers 410a-d and corresponding orientor devices 310 may be operated by a single hot plate chamber control circuitry and orientor control circuitry, respectively.

Figure 6:
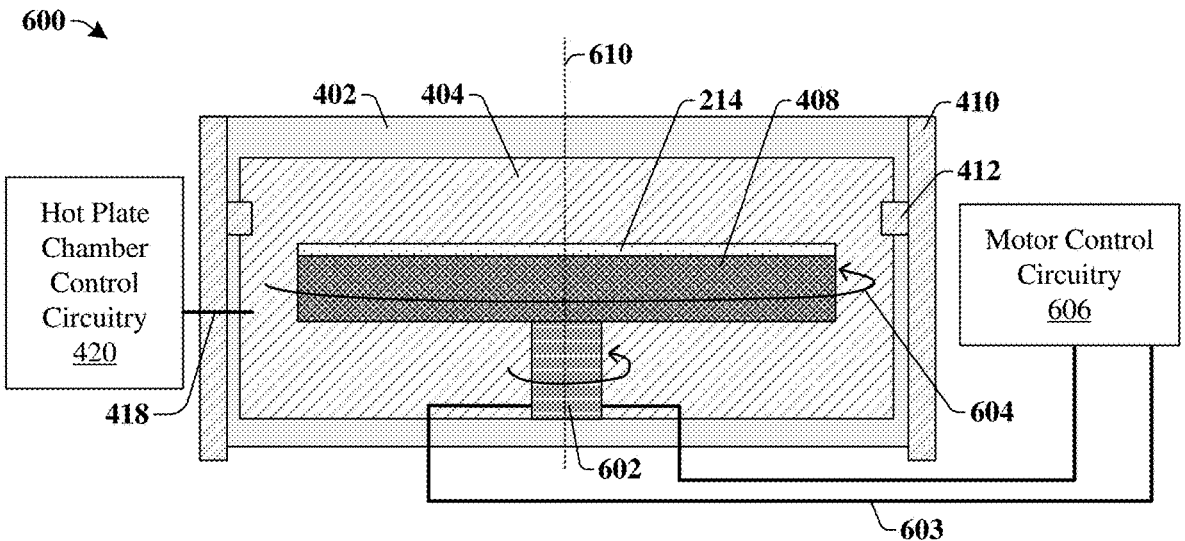
FIG. 6 illustrates a cross-sectional view of some embodiments of a hot plate chamber comprising a rotational device configured to rotate a hot plate during baking processes to reduce variation in breakdown voltage of a piezoelectric structure.

FIG. 6 illustrates a cross-sectional view 600 of some alternative embodiments of a hot plate chamber used in a sol-gel process and comprising a motor to continuously rotate a hot plate in the hot plate chamber.

In some embodiments, the hot plate chamber 404 may comprise a motor 602 or some suitable rotational device configured to rotate 604 the hot plate 408 around an axis of rotation 610 extending through and normal to an upper surface of the hot plate 408. In some embodiments, for example, the motor 602 may be or comprise an actuator. In some embodiments, the hot plate 408 and thus, also the wafer 214, may be continuously rotated during a baking process in the hot plate chamber 404. In some embodiments, the motor 602 may be coupled to and controlled by motor control circuitry 606. In some embodiments, the motor control circuitry 606 may be arranged within the hot plate chamber 404, whereas in other embodiments, the motor control circuitry 606 may be arranged outside of the hot plate chamber 404. Further, in some embodiments, the motor control circuitry 606 may be coupled to the motor 602 through wires 603, whereas in other embodiments, the motor control circuitry 606 may be coupled to the motor 602 wirelessly. The motor control circuitry 606 and the motor 602 may be configured to rotate 604 the hot plate 408 a full 360-degree rotation during the baking process at a constant speed (e.g., rotations per minute) in some embodiments. In some embodiments, the motor control circuitry 606 and the motor 602 may be configured to rotate 604 the hot plate 408 multiple, full 360-degree rotations during the baking process.

In some embodiments, the distribution of gases exiting the hot plate chamber 404 through the gas pore openings 412 may be more even throughout the wafer 214 because of the wafer 214 is continuously rotating. As a result, the solid layer (e.g., the piezoelectric structure 108 of FIG. 1) formed from the sol-gel solution layer may have a more uniform composition and thus, a smaller variation in properties (e.g., breakdown voltage) throughout the solid layer (e.g., the piezoelectric structure 108 of FIG. 1). Further, in some embodiments, wherein the hot plate chamber 404 comprises the motor 602, the baking process may comprise a single cycle, which increases manufacturing efficiency.

Figure 7:
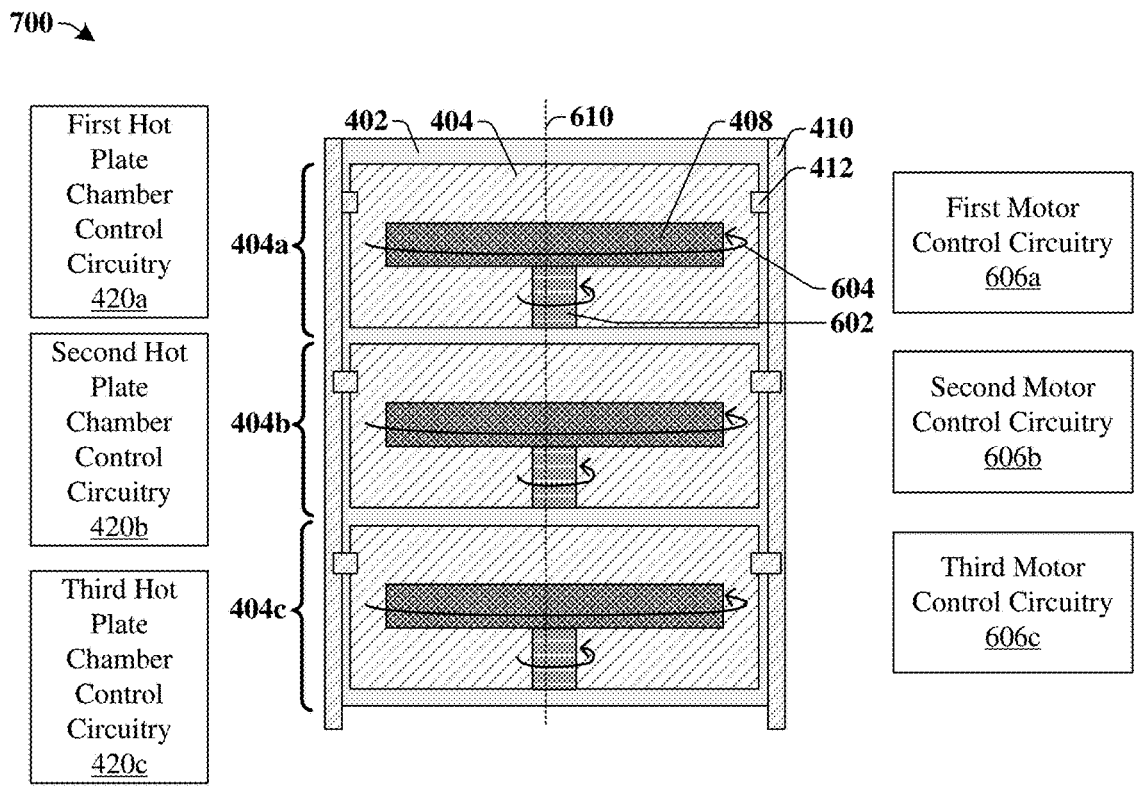
FIG. 7 illustrates a cross-sectional view of some embodiments of multiple hot plate chambers in a hot plate tool, wherein each hot plate chamber comprises a rotational device configured to rotate a hot plate during baking processes to reduce variation in breakdown voltage of a piezoelectric structure.

FIG. 7 illustrates a cross-sectional view 700 of some embodiments of multiple hot plate chambers comprising motors configured to continuously rotate the hot plates and that are vertically stacked to increase manufacturing efficiency.

The cross-sectional view 700 includes a first hot plate chamber 404a, a second hot plate chamber 404b, and a third hot plate chamber 404c vertical arranged in the structural housing 402. Thus, multiple wafers (214 of FIG. 6) may be simultaneously processed, thereby increasing manufacturing efficiency. It will be appreciated that in other embodiments, there may be more or less than the three hot plate chambers (404a-c) vertically arranged in the structural housing 402. In some embodiments, each of the first through third hot plate chambers 404a-c may comprise a motor 602 configured to rotate 604 the hot plate 408 around the axis of rotation 610 during a baking process. In some embodiments, the first hot plate chamber 404a and the motor 602 of the first hot plate chamber 404a may be coupled to the first hot plate chamber control circuitry 420a and first motor control circuitry 606a, respectively; the second hot plate chamber 404b and the motor 602 of the second hot plate chamber 404b may be coupled to the second hot plate chamber control circuitry 420b and second motor control circuitry 606b, respectively; and the third hot plate chamber 404c and the motor 602 of the third hot plate chamber 404c may be coupled to the third hot plate chamber control circuitry 420c and third moto control circuitry 606c, respectively. In other embodiments, each of the first through third hot plate chambers 404a-c and corresponding motors 602 may be operated by a single hot plate control circuitry and motor control circuitry, respectively.

FIGS. 8-18 illustrate various views 800-1800 of some embodiments of a method of forming a piezoelectric structure on a wafer by a sol-gel process using a continuously rotating hot plate. Although FIGS. 8-18 are described in relation to a method, it will be appreciated that the structures disclosed in FIGS. 8-18 are not limited to such a method, but instead may stand alone as structures independent of the method.

Figure 8:
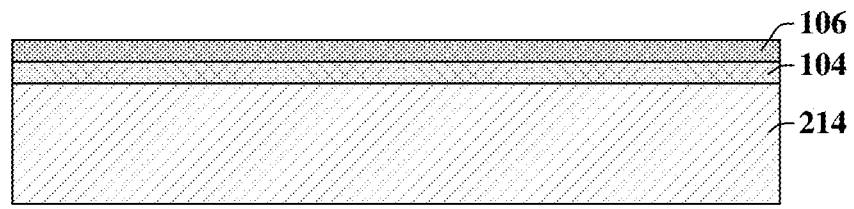
FIGS. 8-18 illustrate various views of some embodiments of a method of forming a piezoelectric structure over a wafer using a hot plate chamber comprising a motor configured to rotate a hot plate during baking processes to reduce variation in breakdown voltage of the piezoelectric structure.

As shown in cross-sectional view 800 of FIG. 8, a wafer 214 is provided. In some embodiments, the wafer 214 may be or comprise a semiconductor material. In some embodiments, the wafer 214 may comprise any type of semiconductor body (e.g., silicon/CMOS bulk, silicon, germanium, SiGe, SOI, etc.). In some embodiments, a passivation layer 104 may be formed on the wafer 214. In some embodiments, the passivation layer 104 may comprise titanium oxide, silicon dioxide, silicon nitride, or some other suitable passivation material. In some embodiments, the passivation layer 104 may be formed by way of a deposition process (e.g., physical vapor deposition (PVD), chemical vapor deposition (CVD), plasma enhanced CVD (PE-CVD), atomic layer deposition (ALD), sputtering, etc.).

Further, in some embodiments, a bottom electrode 106 may be formed over the wafer 214. In some embodiments, the bottom electrode 106 is formed directly on the passivation layer 104. In some embodiments, the bottom electrode 106 may comprise, for example, copper, platinum, gold, silver, titanium, cobalt, titanium nitride, manganese, zinc, or some other suitable conductive material. In some embodiments, the bottom electrode 106 may be formed by way of a deposition process (e.g., PVD, CVD, PE-CVD, ALD, sputtering, etc.).

Figure 9:
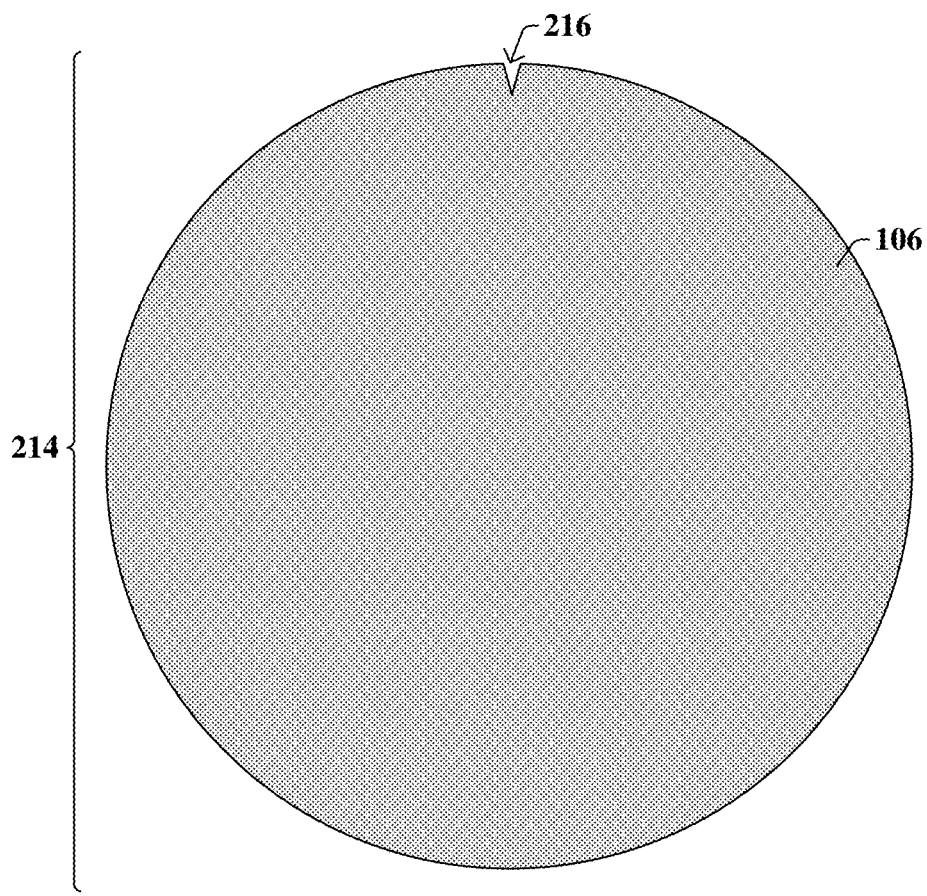

FIG. 9 illustrates a top-view 900 of some embodiments of the cross-sectional view 800 of FIG. 8 after the formation of the bottom electrode 106.

As shown in the top-view 900 of FIG. 9, in some embodiments, the wafer 214 has a substantially circular shape from the top-view 900. However, in some embodiments, the wafer 214 comprises a notch 216 near an edge of the wafer 214. The notch 216 in the wafer 214 may be described as an indent in the wafer 214. In some embodiments, the notch 216 may have a pointed profile like in the top-view of FIG. 9, whereas in other embodiments, the notch 216 may have a rounded profile. Nevertheless, the location of the notch 216 may be used in future processing steps to align the wafer 214 in processing tools.

Figure 10:
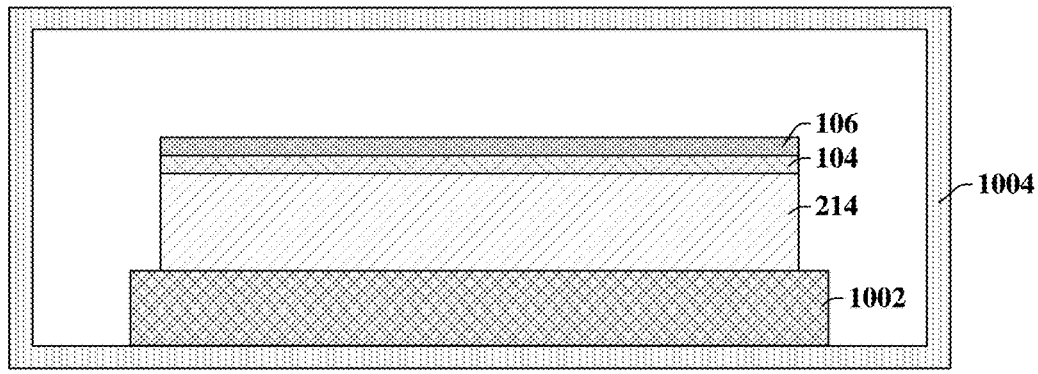

As shown in cross-sectional view 1000 of FIG. 10, in some embodiments, the wafer 214 may be transported into a cooling chamber defined by cooling chamber housing 1004. In some embodiments, the cooling chamber housing 1004 may comprise a wafer chuck 1002, wherein the wafer 214 is placed on the wafer chuck 1002. In some embodiments, the wafer chuck 1002 may also be a cooling plate, wherein the wafer chuck 1002 comprises a cooling element configured to reduce a temperature of the wafer chuck 1002. In some embodiments, the cooling chamber may cool the wafer 214 and overlying layers (e.g., the passivation layer 104, the bottom electrode 106) to a temperature in a range of between, for example, approximately 20 degrees Celsius and approximately 26 degrees Celsius. Thus, in some embodiments, the wafer 214 is inserted into the cooling chamber housing 1004 after the formation of the bottom electrode 106 over the wafer 214 to reduce a temperature of the bottom electrode 106 for future processing steps.

Figure 11:
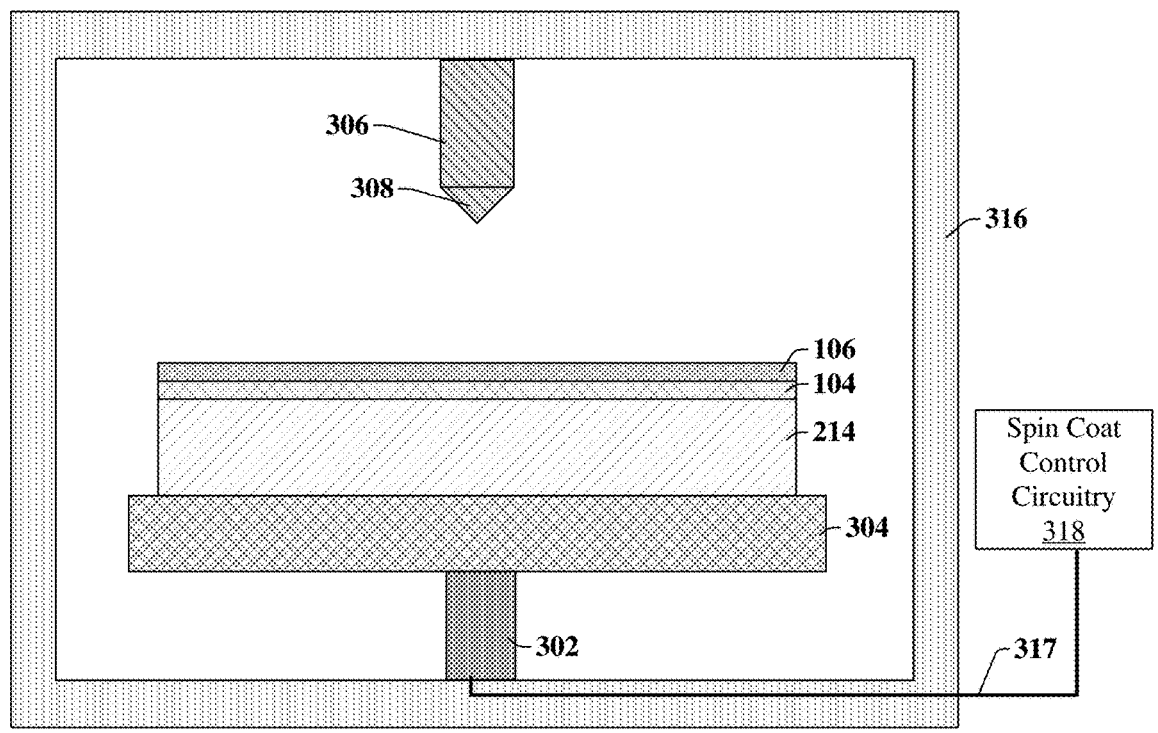

As shown in cross-sectional view 1100 of FIG. 11, in some embodiments, the wafer 214 may be transported into a spin-coat tool defined by spin-coat tool housing 316. In such embodiments, the wafer 214 may be loaded onto a wafer chuck 304 coupled to a rotatable shaft 302. In some embodiments, the rotatable shaft 302 is coupled to spin coat control circuitry 318 through wires 317 or wirelessly. Further, in some embodiments, a solution housing 306 and nozzle 308 are arranged at a top of the spin-coat tool housing 316 and overlie the wafer 214.

Figure 12:
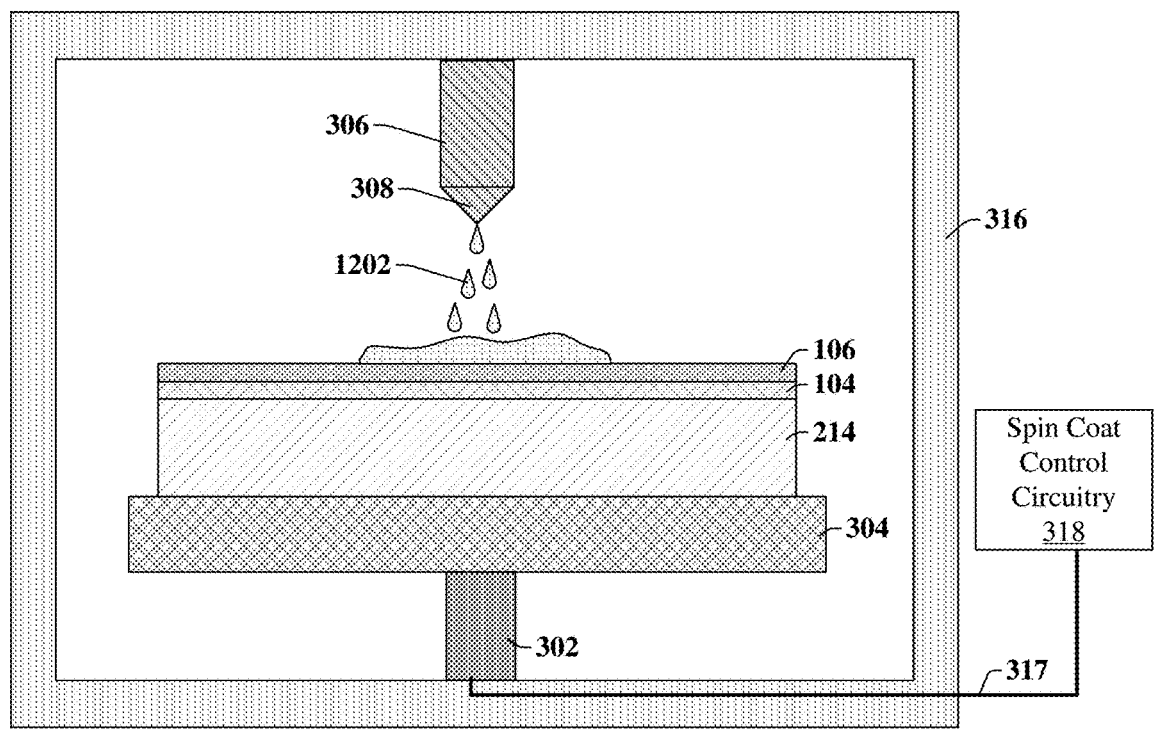

As shown in cross-sectional view 1200 of FIG. 12, in some embodiments, a sol-gel solution 2022 is deposited onto the wafer 214 from the solution housing 306 and the nozzle 308. In some embodiments, the sol-gel solution 2022 comprises a colloidal solution when initially deposited on the bottom electrode 106. In some embodiments, the sol-gel solution 2022 comprises, for example, lead, zirconium, and titanium dispersed in one or more solvents. In such embodiments, the sol-gel solution 2022 may be used to form a piezoelectric layer comprising lead zirconate titanate. In some embodiments, the one or more solvents may comprise carbon, hydrogen, and/or oxygen. It will be appreciated that in some other embodiments, the sol-gel solution 1202 may comprise other metals than lead, zirconium, and/or titanium dispersed in one or more solvents to produce a piezoelectric layer other than lead zirconate titanate.

Figure 13:
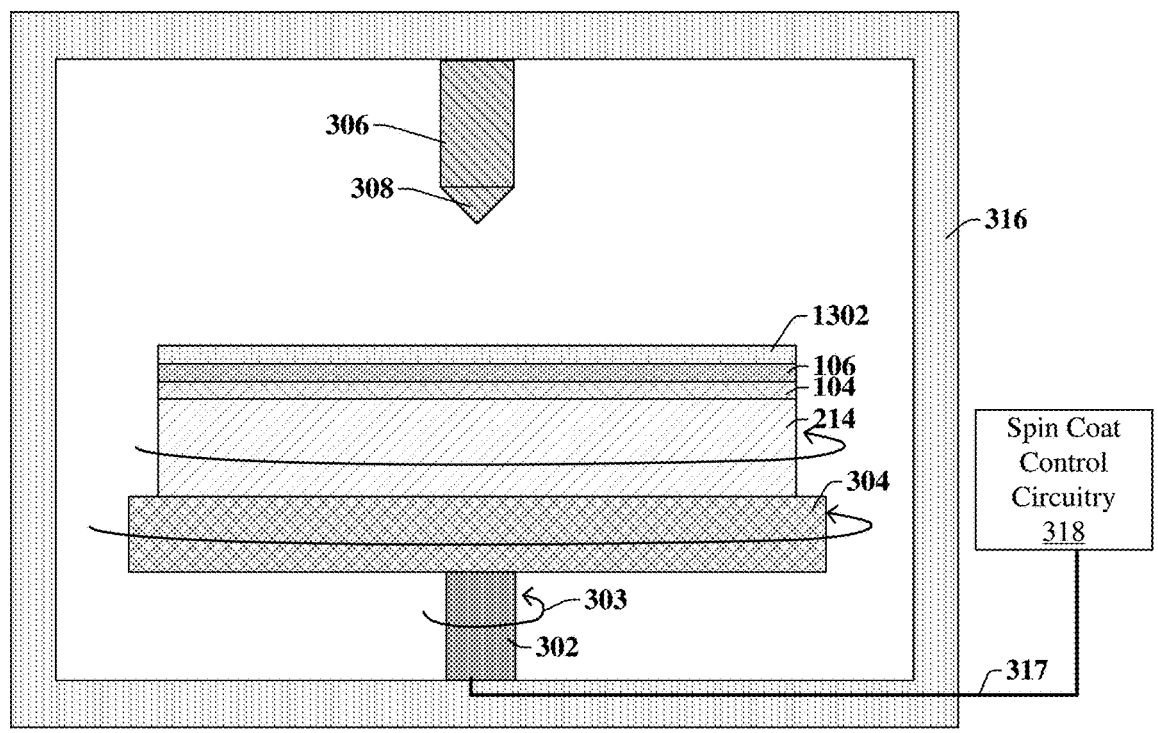

As shown in cross-sectional view 1300 of FIG. 13, in some embodiments, the spin coat control circuitry 318 turns the rotatable shaft 302 "ON" to rotate 303 the rotatable shaft 302, the wafer chuck 304, and thus, the wafer 214. In such embodiments, the sol-gel solution (1202 of FIG. 12) is distributed evenly over the wafer 214 and the bottom electrode 106 as a sol-gel solution layer 1302. In some embodiments, the deposition of the sol-gel solution (1202 of FIG. 12) and the rotating 303 of the wafer 214 in FIG. 13 are performed simultaneously, whereas in other embodiments, the sol-gel solution (1202 of FIG. 12) is deposited, and then, the rotatable shaft 302 is rotated 303. Nevertheless, the steps in FIGS. 12 and 13 make up a spin-coat process in the sol-gel process in order to even distribute the sol-gel solution (1202 of FIG. 12) into a sol-gel solution layer 1302 on the wafer 214.

Figure 14:
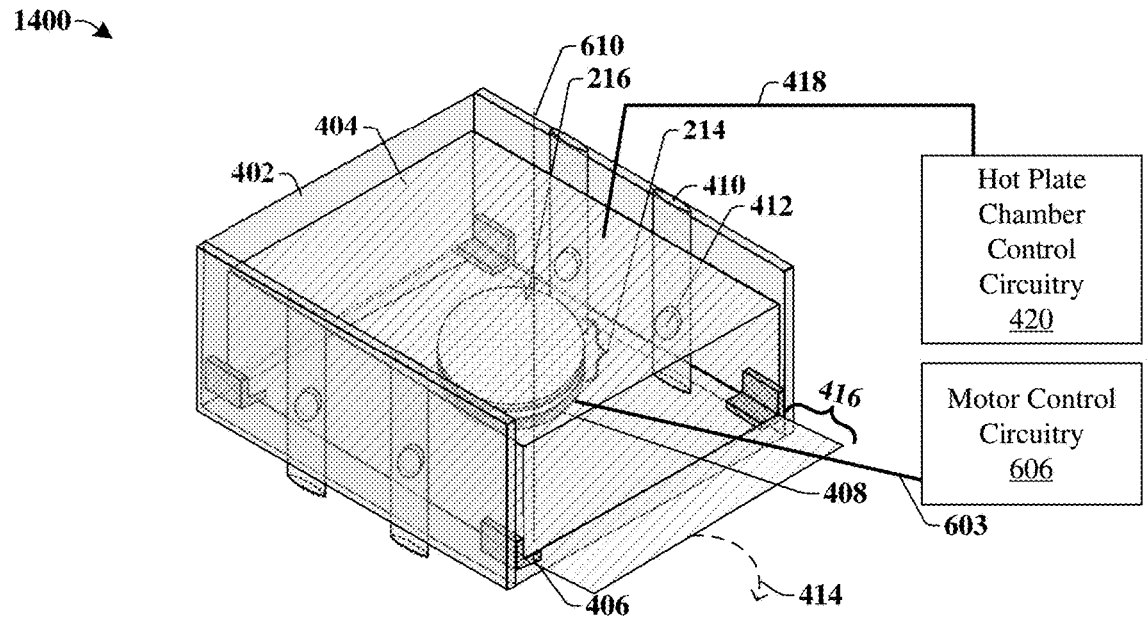

As shown in perspective view 1400 of FIG. 14, in some embodiments, the wafer 214 is transported into a hot plate chamber 404. In such embodiments, a door 416 of the hot plate chamber 404 may be opened 414 to load the wafer 214 onto a hot plate 408 within the hot plate chamber 404. In some embodiments, the hot plate 408 may comprise a wafer chuck having an upper surface configured to hold the wafer 214 and may also comprise a heating element configured to increase a temperature of the wafer chuck, and thus, the wafer 214. In some embodiments, the hot plate chamber 404 may be held in a structural housing 402 by hot plate holder structures 406. In some embodiments, gas pore openings 412 may be arranged within the hot plate chamber 404 and coupled to gas exhaust lines 410 arranged on or within the structural housing 402. In some embodiments, the hot plate chamber 404 and/or hot plate 408 are coupled to hot plate chamber control circuitry 420 through wires 418 or wirelessly, and a motor (see, 602 of FIG. 15) is coupled to motor control circuitry 606 through wires 603 or wirelessly.

Figure 15:
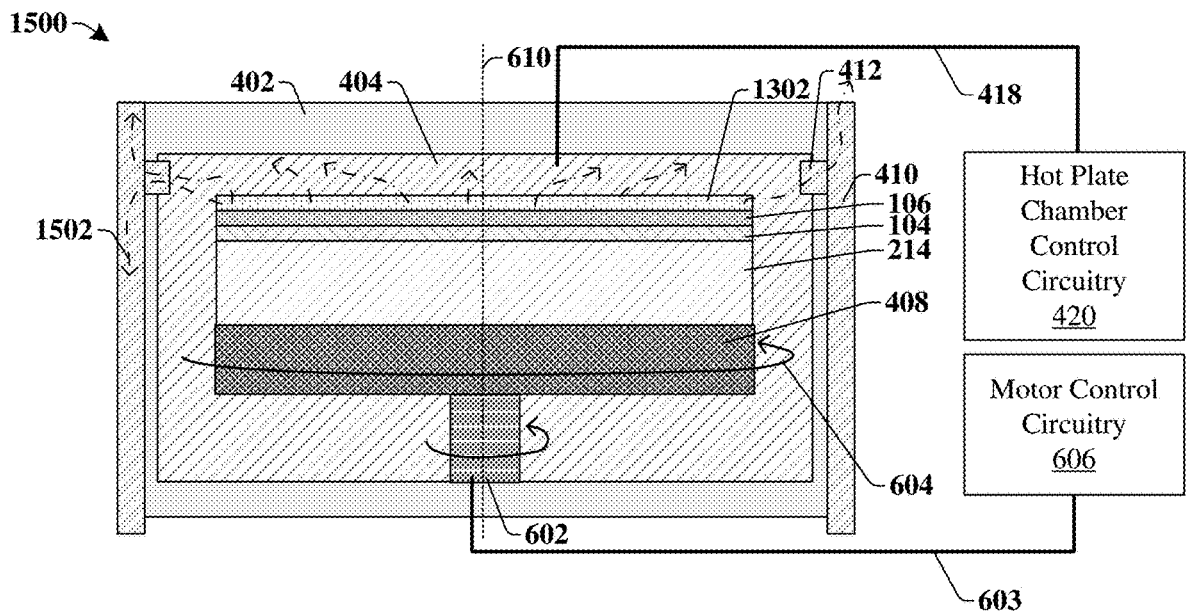

As shown in cross-sectional view 1500 of FIG. 15, in some embodiments, a motor 602 may be arranged within the hot plate chamber 404 and coupled to the hot plate 408. In some embodiments, the door (416 of FIG. 14) hot plate chamber 404 may be closed, and a baking process may be performed as controlled by the hot plate chamber control circuitry 420. In such embodiments, the motor control circuitry 606 may turn the motor 602 "ON" to rotate 604 the motor 602, the hot plate 408, and subsequently, the wafer 214 around an axis of rotation 610 that extends through and is perpendicular to an upper surface of the hot plate 408. In such embodiments, the motor 602 is continuously rotated 604 throughout the baking process. In some embodiments, the motor control circuitry 606 and the hot plate chamber control circuitry 420 work simultaneously such that the wafer 214 is continuously spinning while the baking process is being conducted such that the wafer 214 is arranged at different orientations in the hot plate chamber 404 throughout the baking process. This way, in such embodiments, gases 1502 from the one or more solvents from the sol-gel solution layer 1302 may more evenly exit out of the hot plate chamber 404 through the gas pore openings 412. With a more even distribution of the removal of gases 1502 from the hot plate chamber 404, the sol-gel solution layer 1302 may more uniformly transform into a solid layer having a low variation in composition throughout the wafer 214.

In some embodiments, the baking process comprises a drying step and a decomposition step. In some embodiments, the drying step may be performed at a first temperature, and the decomposition step may be performed at a second temperature greater than the first temperature. For example, in some embodiments, the drying step may be performed at the first temperature in a range of between approximately 120 degrees Celsius and approximately 140 degrees Celsius, whereas the decomposition step may be performed at the second temperature in a range of between approximately 340 degrees Celsius and approximately 360 degrees Celsius. In some embodiments, during the drying step of the baking process, majority (e.g., greater than 50 percent) of the one or more solvents evaporate and exit the hot plate chamber 404 as gases 1502 through the gas pore openings 412. In some embodiments, after the drying process, the sol-gel solution layer 1302 may be described as a "gel-like" material having a liquid and solid phase. Then, in some embodiments, during the decomposition step of the baking process, the temperature of the hot plate 408 and/or the hot plate chamber 404 is increased to the second temperature to further dry, decompose, and densify the sol-gel solution layer 1302 to form a first piezoelectric layer (see, 108a of FIG. 17) that is a solid layer arranged over the bottom electrode 106. Because of the continuous rotation 604 of the hot plate 408 by the motor 602 while the hot plate 408 is at high temperatures, the resulting first piezoelectric layer (see, 108a of FIG. 17) may have a reduced variation in composition and thus, properties (e.g., breakdown voltage) throughout the first piezoelectric layer (see, 108a of FIG. 17).

Figure 16:
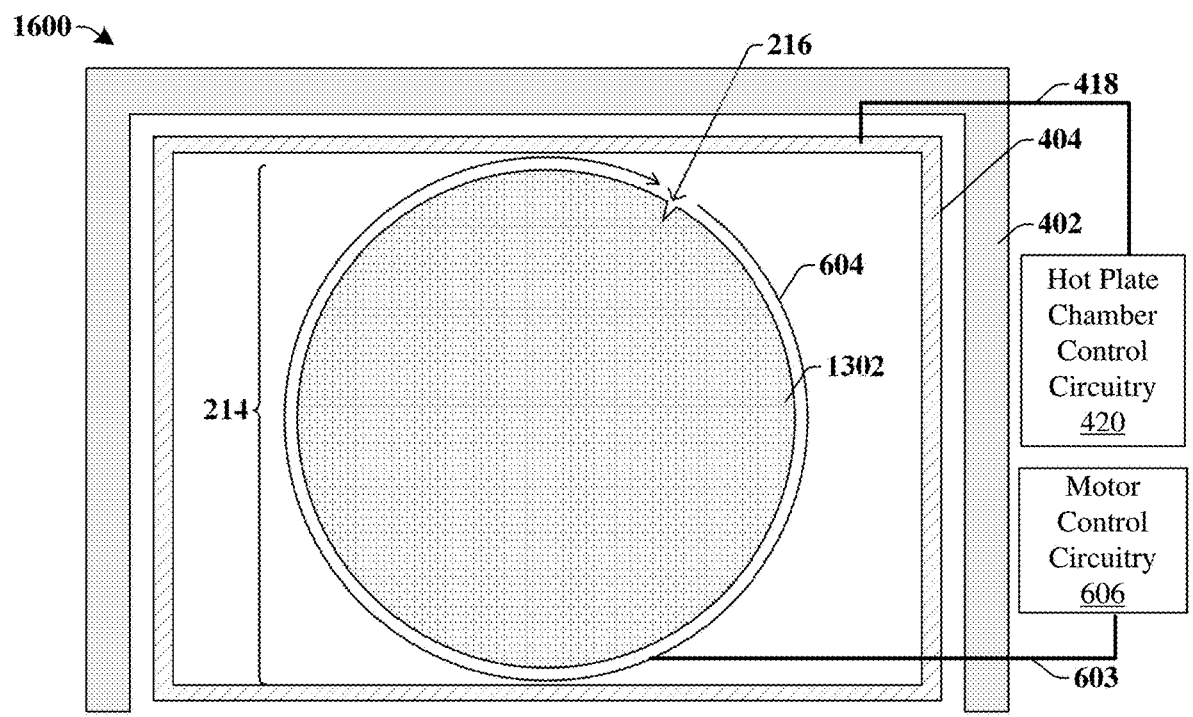

FIG. 16 illustrates a top-view 1600 of some embodiments corresponding to the baking process of FIG. 15, wherein the wafer 214 is continuously rotated 604.

As shown in the top-view 1600, in some embodiments, the wafer 214 is rotated at least a full 360-degree rotation during the baking process. In some embodiments, the wafer 214 is rotated a full 360-degree rotation multiple times throughout the baking process to ensure an even exit of gases (1502 of FIG. 15) from the hot plate chamber 404. In some embodiments, the motor control circuitry 606 controls the speed (e.g., rotations per minute) of the motor (602 of FIG. 15). Further, in some embodiments, the notch 216 of the wafer 214 may be used to ensure that the wafer 214 is centered/aligned on the hot plate (408 of FIG. 15).

Figure 17:
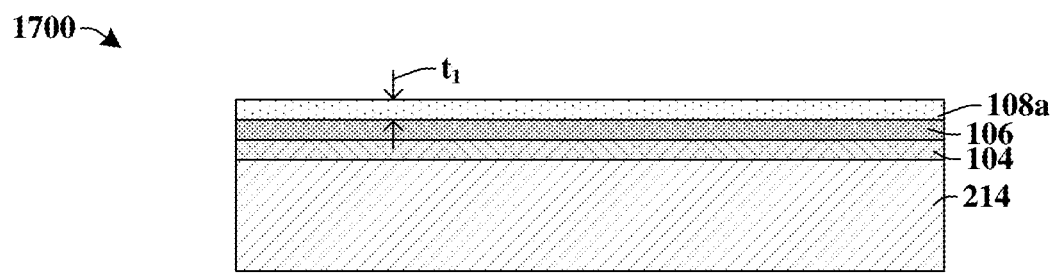

As shown in cross-sectional view 1700 of FIG. 17, in some embodiments, after the baking process, a first piezoelectric layer 108a is formed over the bottom electrode 106 on the wafer 214. In such embodiments, the first piezoelectric layer 108a may have a first thickness $t_1$. In some embodiments, the first thickness $t_1$ is in a range of between, for example, approximately 500 angstroms and approximately 3000 angstroms. In some embodiments, the first piezoelectric layer 108a comprises a piezoelectric material such as, for example, lead zirconate titanate. In other embodiments, the first piezoelectric layer 108a may comprise some other piezoelectric material such as, for example, aluminum nitride, lithium niobate, gallium arsenide, zinc oxide, quartz single crystals, polymer-film piezoelectrics, or some other suitable piezoelectric material. Because of the continuous rotation of the wafer 214 throughout the baking process, the first piezoelectric layer 108a may have a reduction in variation in composition throughout its area on the wafer 214. In some embodiments, for example, a first area of the first piezoelectric layer 108a may have a first concentration of a first element, whereas a second area of the first piezoelectric layer 108a may have a second concentration of the first element that is different than the first concentration. However, because of the continuous rotation of the wafer 214 during the baking process, a difference between the first and second concentrations may be reduced. As a result, the first piezoelectric layer 108a may have more uniform (i.e., less variation in) properties (e.g., breakdown voltage) throughout its area on the wafer 214.

Figure 18:
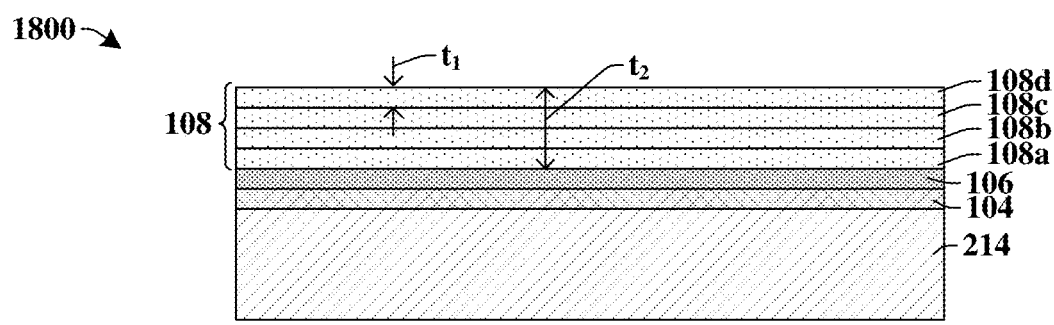

As shown in cross-sectional view 1800 of FIG. 18, in some embodiments, the steps illustrated in FIGS. 10-17 are repeated several times to produce a piezoelectric structure 108 comprising multiple piezoelectric layers (e.g., 108a-d). For example, in some embodiments, the piezoelectric structure 108 may comprise a second piezoelectric layer 108b arranged over the first piezoelectric layer 108a, a third piezoelectric layer 108c arranged over the second piezoelectric layer 108b, and a fourth piezoelectric layer 108d arranged over the third piezoelectric layer 108c. In other embodiments, the piezoelectric structure 108 may comprise more or less than the first through fourth piezoelectric layers 108a-d. Further, in some embodiments, the piezoelectric structure 108 may comprise a same piezoelectric material throughout the first through fourth piezoelectric layers 108a-d. In some embodiments, the piezoelectric structure 108 may have a second thickness $t_2$ in a range of between, for example, approximately 2,000 angstroms and approximately 30,000 angstroms. Because each of the first through fourth piezoelectric layers 108a-d were formed to have a reduced variation in composition by continuously rotating the hot plate (408 of FIG. 14) during baking processes, the overall piezoelectric structure 108 may also have a reduced variation in composition and thus, a reduced variation in properties (e.g., breakdown voltage) thereby increasing reliability of the piezoelectric structure 108.

Figure 19:
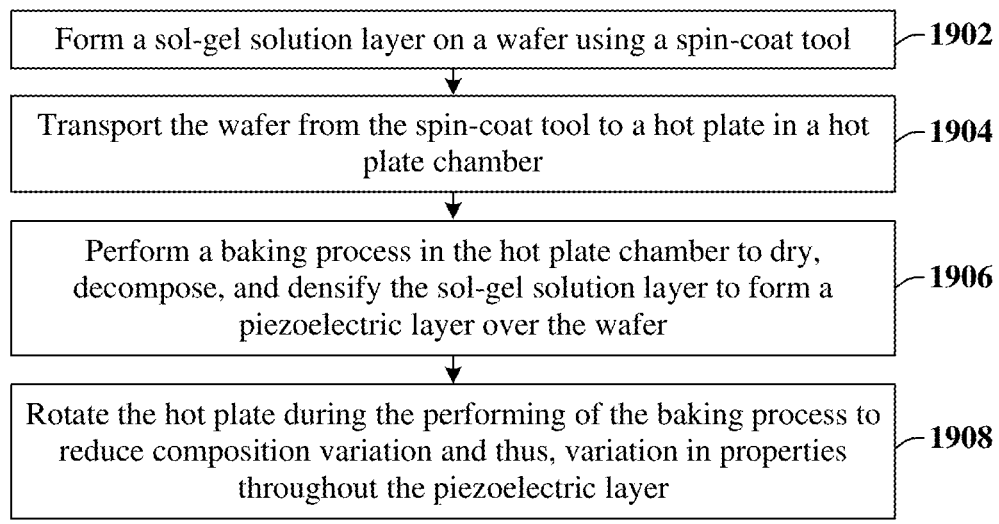
FIG. 19 illustrates a flow diagram of some embodiments corresponding to the method of FIGS. 8-18.

FIG. 19 illustrates a flow diagram of some embodiments of a method 1900 corresponding to FIGS. 8-18.

While method 1900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1902, a sol-gel solution layer is formed on a wafer using a spin-coat tool. FIG. 13 illustrates a cross-sectional view 1300 of some embodiments corresponding to act 1902.

At act 1904, the wafer is transported from the spin-coat tool to a hot plate in a hot plate chamber. FIG. 14 illustrates a perspective view 1400 of some embodiments corresponding to act 1904.

At act 1906, a baking process is performed in the hot plate chamber to dry, decompose, and densify the sol-gel solution layer to form a piezoelectric layer over the wafer.

At act 1908, the hot plate is rotated during the performing of the baking process to reduce composition variation and thus, variation in properties throughout the piezoelectric layer. FIG. 15 illustrates a cross-sectional view 1500 of some embodiments corresponding to acts 1906 and 1908.

FIGS. 20A-23 illustrate various views 2000A-2300 of some alternative embodiments of a method of forming a piezoelectric structure on a wafer by a sol-gel process using an orientor device in a hot plate chamber. Although FIGS. 20A-23 are described in relation to a method, it will be appreciated that the structures disclosed in FIGS. 20A-23 are not limited to such a method, but instead may stand alone as structures independent of the method.

In some such alternative embodiments, a method of forming the first piezoelectric layer (108a of FIG. 17) over the wafer 214 includes the formation of a sol-gel solution layer 1302 over a bottom electrode 106 on a wafer 214 as illustrated in FIGS. 8-13. Then, the method may proceed from FIG. 13 to FIG. 20A.

Figure 20A:
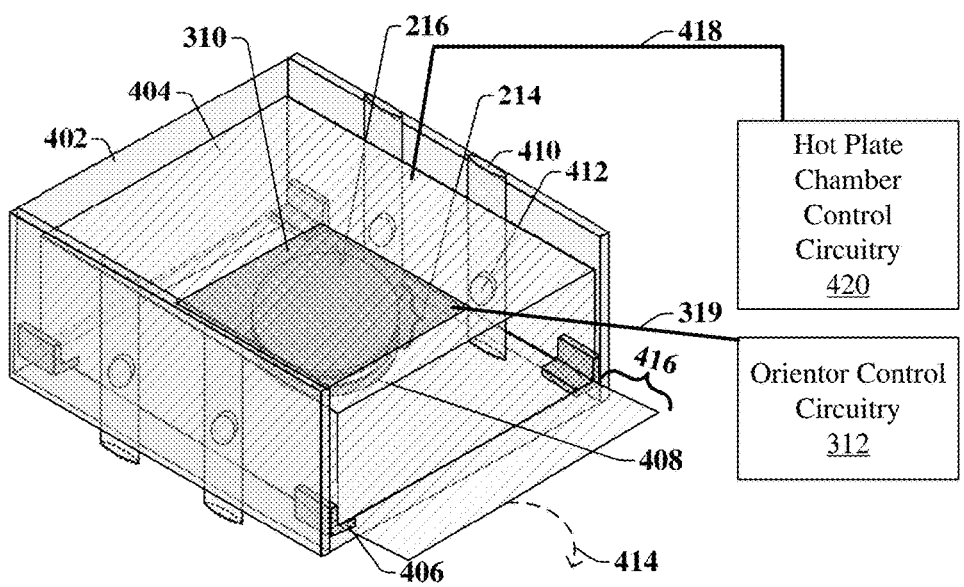
FIGS. 20A-23 illustrate various views of some other embodiments of method of forming a piezoelectric structure over a wafer using a hot plate chamber comprising an orientor device used to form the piezoelectric structure with a small variation in breakdown voltage.

As shown in perspective view 2000A of FIG. 20A, in some embodiments, the wafer 214 is transported from the spin-coat tool of FIG. 13 to a hot plate chamber 404 in FIG. 20A. The hot plate 408 may comprise a wafer chuck configured to hold the wafer 214 and a heating element configured to heat up the wafer chuck and the wafer 214. In some such embodiments, the hot plate chamber 404 may include an orientor device 310 arranged within the hot plate chamber 404 and over the hot plate 408. The orientor device 310 may comprise an optical image device and an alignment device, in some embodiments. In some embodiments, the optical image device and the alignment device are arranged within the hot plate chamber 404, whereas in other embodiments, one of the optical image device or the alignment device of the orientor device 310 may be arranged outside of the hot plate chamber 404. Nevertheless, in some embodiments, the door 416 of the hot plate chamber 404 may be opened 414, and the wafer 214 may be transported onto the hot plate 408 after the spin-coat process of FIGS. 11-13.

Figure 20B:
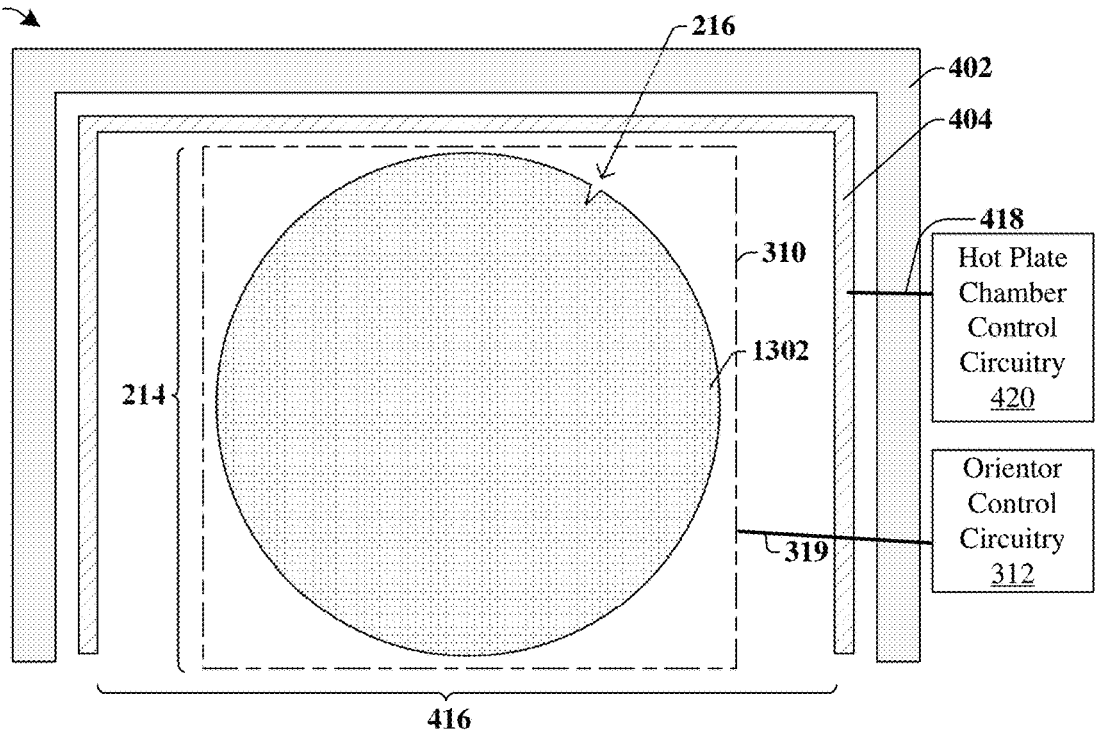

FIG. 20B illustrates a top-view 2000B of some embodiments of the wafer 214 in the hot plate chamber 404 corresponding to the perspective view 2000A of FIG. 20A.

As shown in the top-view 2000B, in some embodiments, the notch 216 in the wafer 214 may be arranged at some arbitrary position in the hot plate chamber 404. After the wafer 214 is arranged on the hot plate (408 of FIG. 20A) of the hot plate chamber 404, the orientor control circuitry 312 is configured to operate the orientor device 310 to identify the location of the notch 216 of the wafer 214. In some embodiments, the door 416 of the hot plate chamber 404 may be opened, whereas in other embodiments, the door 416 of the hot plate chamber 404 may be closed while the orientor device 310 locates the notch 216. In some embodiments, the orientor device 310 uses some type of optical image device (e.g., CCD image sensor, CMOS image sensor, ToF camera, etc.) to locate the notch 216 on the wafer 214.

Figure 21:
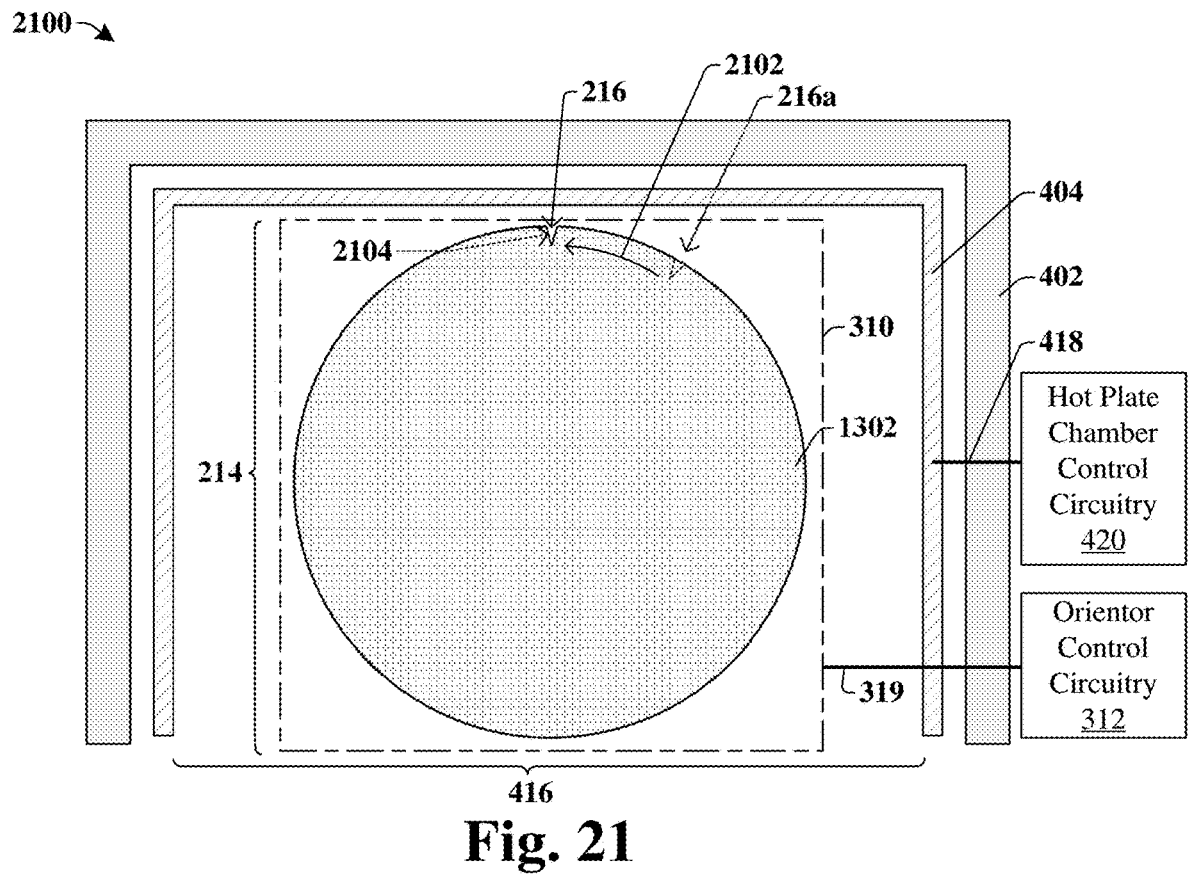

As shown in top-view 2100 of FIG. 21, the orientor control circuitry 312 may be configured to use the alignment device of the orientor device 310 to rotate 2102 the wafer such that the notch 216 is moved from its arbitrary location 216a to a first predetermined position 2104 within the hot plate chamber 404. In some embodiments, the alignment device of the orientor device 310 may comprise some type of rotational device coupled to the hot plate (408 of FIG. 20A) to rotate 2102 the hot plate (408 of FIG. 20A) to put the notch 216 at the first predetermined position 2104 within the hot plate chamber 404. In other embodiments, the alignment device of the orientor device 310 may comprise some type of robotic arm configured to pick up and rotate 2102 the wafer 214 such that the notch is at the first predetermined position 2104. In such embodiments, the robotic arm or alignment device of the orientor device 310 may be arranged within the hot plate chamber 404, whereas in other embodiments, the robotic arm or alignment device of the orientor device 310 may be arranged outside of the hot plate chamber 404 such that the door 416 of the hot plate chamber 404 is opened to rotate 2102 the wafer 214.

In some embodiments, the first predetermined position 2104 of the notch 216 may be arranged directly across from the door 416 of the hot plate chamber. In other embodiments, the first predetermined position 2104 of the notch 216 may be arranged at some other location than what is illustrated in the top-view 2100 of FIG. 21. Nevertheless, in some embodiments, prior to performing a baking process, the orientor device 310 within the hot plate chamber 404 may be used to orient the notch 216 of the wafer 214 to be at the first predetermined position 2104 within the hot plate chamber 404.

Figure 22:
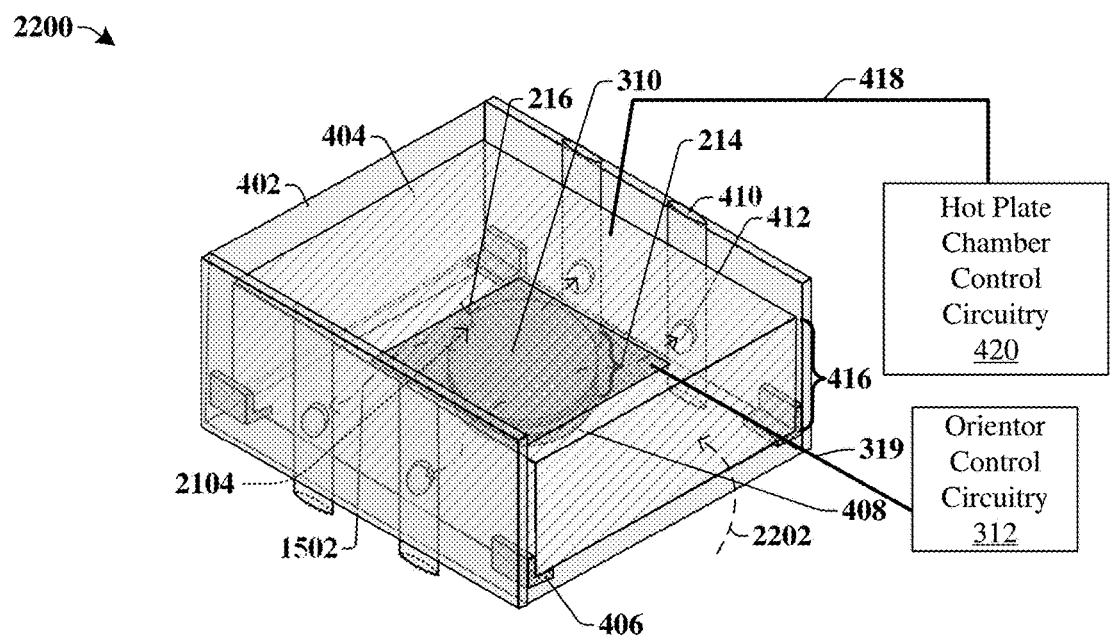

As shown in perspective view 2200 of FIG. 22, in some embodiments, the door 416 to the hot plate chamber 404 is closed 2202, and a first cycle of a baking process is performed within the hot plate chamber 404 as controlled by the hot plate chamber control circuitry 420. In such embodiments, the first cycle of the baking process is performed while the notch 216 of the wafer 214 is arranged at the first predetermined position 2104 in the hot plate chamber 404. In some embodiments, the wafer 214 remains stationary while the first cycle of the baking process is performed. In some embodiments, the first cycle of the baking process includes the drying step at the first temperature and the decomposition step at the second temperature greater than the first temperature. In some embodiments, during the first cycle of the baking process, gases 1502 are released through the gas pore openings 412 and the gas exhaust lines 410. In some embodiments, during the first cycle of the baking process, only a portion of the solvent in the sol-gel solution layer (1302 of FIG. 21) is evaporated. Thus, in some embodiments, a solid layer comprising piezoelectric material is not yet formed after the first cycle of the baking process.

Figure 23:
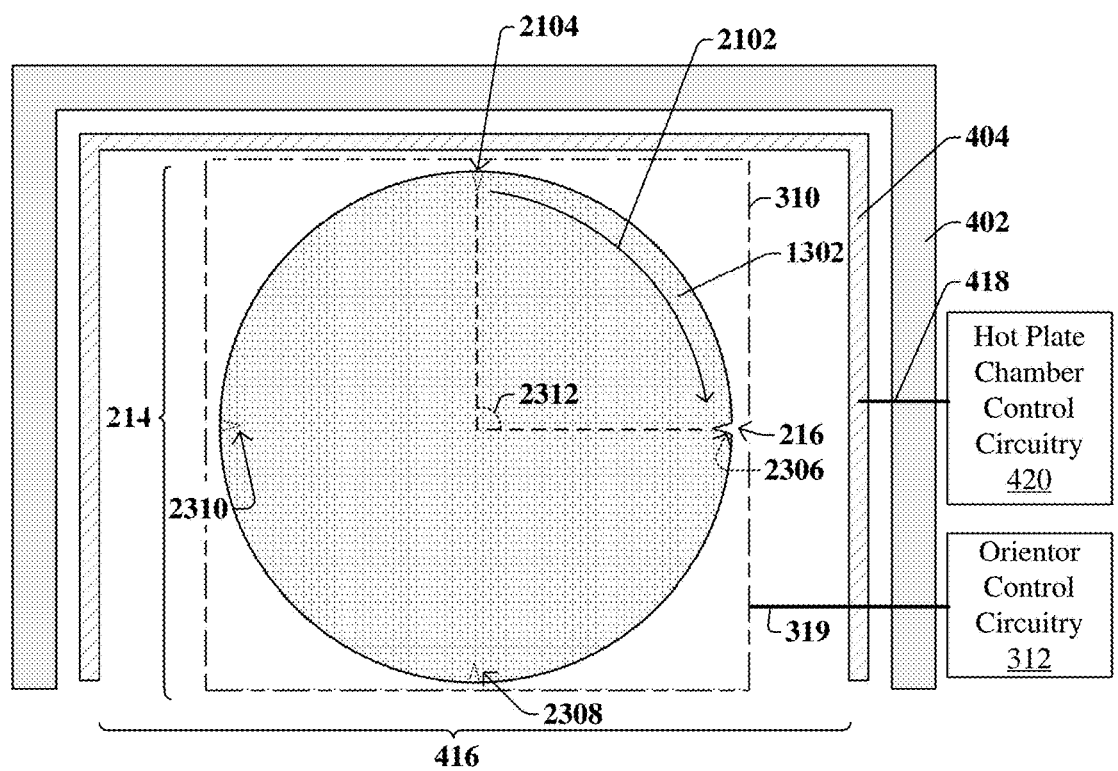

As shown in the top-view 2300 of FIG. 23, in some embodiments, after the first cycle of the baking process, the orientor control circuitry 312 may operate the orientor device 310 to again rotate 2102 the wafer 214 and/or the hot plate (408 of FIG. 22) such that the notch 216 is arranged at a second predetermined position 2306 within the hot plate chamber 404. In some embodiments, the door 416 of the hot plate chamber 404 is opened to perform the rotation 2102, whereas in other embodiments, the door 416 of the hot plate chamber 404 remains closed to perform the rotation 2102 after the first cycle of the baking process. In some embodiments, the wafer 214 and/or the hot plate (408 of FIG. 22) may be rotated 2102 a predetermined amount of degrees 2312 away from the first predetermined position 2104 to reach the second predetermined position 2306. In some embodiments, the predetermined amount of degrees 2312 is defined as the angle between the first predetermined position 2104 and the second predetermined position 2306, wherein the vertex of the angle is arranged at a center of the wafer 214. In some embodiments, the predetermined amount of degrees 2312 may be equal to approximately 90 degrees. In other embodiments, the predetermined amount of degrees 2312 may be in a range of between, for example, approximately 1 degree and approximately 180 degrees.

Once the orientor device 310 rotates 2102 the wafer 214 such that the notch 216 is arranged at the second predetermined position 2306, a second cycle of the baking process may be performed, in some embodiments. In some embodiments, the second cycle of the baking process may comprise the same parameters (e.g., time, temperature, pressure, etc.) as the first cycle of the baking process. In some embodiments, during the second cycle of the baking process, gases (1502 of FIG. 22) are again released through the gas pore openings (412 of FIG. 22) and the gas exhaust lines (410 of FIG. 22). In some embodiments, during the second cycle of the baking process, only a portion of the solvent in the sol-gel solution layer 1302 is evaporated. Thus, in some embodiments, a solid layer comprising piezoelectric material is not yet formed after the second cycle of the baking process. In other embodiments, a solid layer comprising a piezoelectric material may be formed after the second cycle of the baking process.

In some embodiments, after the second cycle of the baking process, the orientor device 310 may be configured to rotate the wafer 214 and/or the hot plate (408 of FIG. 22) the predetermined amount of degrees 2312 such that the notch 216 of the wafer 214 is arranged at a third predetermined position 2308 within the hot plate chamber 404. The third predetermined position 2308 is arranged at the predetermined amount of degrees 2312 away from the second predetermined position 2306. Then, a third cycle of the baking process may be performed while the notch 216 of the wafer 214 is arranged at the third predetermined position 2308 within the hot plate chamber 404, in some embodiments.

In some embodiments, after the third cycle of the baking process, the orientor device 310 may be configured to rotate the wafer 214 and/or the hot plate (408 of FIG. 22) the predetermined amount of degrees 2312 such that the notch 216 of the wafer 214 is arranged at a fourth predetermined position 2310 within the hot plate chamber 404. The fourth predetermined position 2310 is arranged at the predetermined amount of degrees 2312 away from the third predetermined position 2308. Then, a fourth cycle of the baking process may be performed while the notch 216 of the wafer 214 is arranged at the fourth predetermined position 2310 within the hot plate chamber 404, in some embodiments.

In some embodiments, more or less than four cycles of the baking process may be performed. Further, in some embodiments, each cycle of the baking process may comprise the same parameters (e.g., time, temperature, pressure, etc.), whereas in some other embodiments, at least one of the cycles of the baking process may comprise different parameters (e.g., time, temperature, pressure, etc.) than at least another cycle of the baking process. In some embodiments, each cycle of the baking process may comprise the drying step and the decomposition step. In some other embodiments, the first through fourth cycles of the baking process may be conducted at the parameters for the drying step of the baking process, and then the first through fourth cycles of the baking process at the first through fourth predetermined positions, respectively, may be repeated at the parameters for the decomposition step of the baking process. In some embodiments, the number of cycles of the baking process performed may be equal to 360 degrees divided by the predetermined amount of degrees 2312. For example, in some embodiments, wherein the predetermined amount of degrees 2312 equals about 90 degrees, four cycles of the baking process may be performed.

In such embodiments wherein the wafer 214 is arranged at different orientations (e.g., the first predetermined position 2104, the second predetermined position 2306, the third predetermined position 2308, the fourth predetermined position 2310) within the hot plate chamber 404 throughout the baking process, gases (1502 of FIG. 22) from the sol-gel solution layer 1302 may more evenly exit out of the hot plate chamber 404 through the gas pore openings (412 of FIG. 22). With a more even distribution of the removal of gases 1502 from the hot plate chamber 404, the sol-gel solution layer 1302 may more uniformly transform into a solid layer (e.g., first piezoelectric layer 108a of FIG. 107) having a low variation in composition, and thus properties (e.g., breakdown voltage) throughout the wafer 214.

In some embodiments, it will be appreciated that the method illustrated in FIGS. 8-13 and FIGS. 20A-23 may be repeated to form multiple piezoelectric layers (e.g., the first through fourth piezoelectric layers 108a-d of FIG. 18) over the wafer 214.

Figure 24:
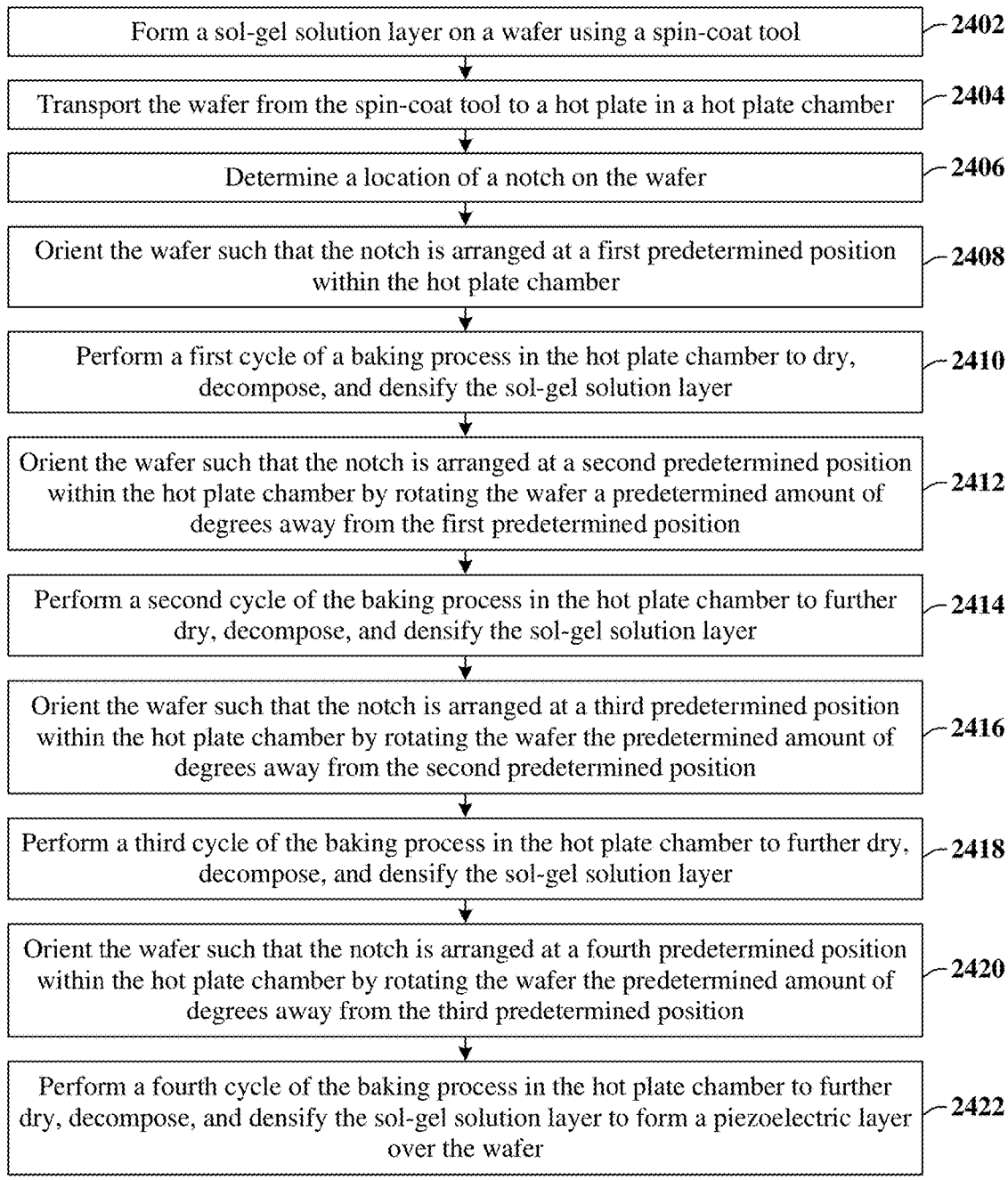
FIG. 24 illustrates a flow diagram of some embodiments corresponding to the method of FIGS. 20A-23.

FIG. 24 illustrates a flow diagram of some embodiments of a method 2400 corresponding to FIGS. 20A-23.

While method 2400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2402, a sol-gel solution layer is formed on a wafer using a spin-coat tool. FIGS. 11-13 illustrate cross-sectional views 1100-1300, respectively, of some embodiments corresponding to act 2402.

At act 2404, the wafer is transported from the spin-coat tool to a hot plate in a hot plate chamber. FIG. 20A illustrates a perspective view 2000A of some embodiments corresponding to act 2404.

At act 2406, a location of a notch on the wafer is determined. FIG. 20B illustrates a top-view 2000B of some embodiments corresponding to act 2406.

At act 2408, the wafer is oriented such that the notch is arranged at a first predetermined position within the hot plate chamber. FIG. 21 illustrates a top-view 2100 of some embodiments corresponding to act 2408.

At act 2410, a first cycle of the baking process is performed to dry, decompose, and densify the sol-gel solution layer. FIG. 22 illustrates a perspective view 2200 of some embodiments corresponding to act 2410.

At act 2412, the wafer is oriented such that the notch is arranged at a second predetermined position within the hot plate chamber by rotating the wafer a predetermined amount of degrees away from the first predetermined position.

At act 2414, a second cycle of the baking process is performed in the hot plate chamber to further dry, decompose, and densify the sol-gel solution layer.

At act 2416, the wafer is oriented such that the notch is arranged at a third predetermined position within the hot plate chamber by rotating the wafer the predetermined amount of degrees away from the second predetermined position.

At act 2418, a third cycle of the baking process is performed in the hot plate chamber to further dry, decompose, and densify the sol-gel solution layer.

At act 2420, the wafer is oriented such that the notch is arranged at a fourth predetermined position within the hot plate chamber by rotating the wafer the predetermined amount of degrees away from the third predetermined position.

At act 2422, a fourth cycle of the baking process is performed in the hot plate chamber to further dry, decompose, and densify the sol-gel solution layer to form a piezoelectric layer over the wafer. FIG. 23 illustrates a top-view 2300 of some embodiments corresponding to acts 2412, 2414, 2416, 2418, 2420, and 2422.

FIGS. 25A-28 illustrate various views 2500A-2800 of some other alternative embodiments of a method of forming a piezoelectric structure on a wafer by a sol-gel process using an orientor device in a spin-coat tool. Although FIGS. 25A-28 are described in relation to a method, it will be appreciated that the structures disclosed in FIGS. 25A-28 are not limited to such a method, but instead may stand alone as structures independent of the method.

In some other alternative embodiments, a method of forming the first piezoelectric layer (108a of FIG. 17) over the wafer 214 includes the formation of a sol-gel solution layer 1302 over a bottom electrode 106 on a wafer 214 as illustrated in FIGS. 8-13. Then, the method may proceed from FIG. 13 to FIG. 25A.

Figure 25A:
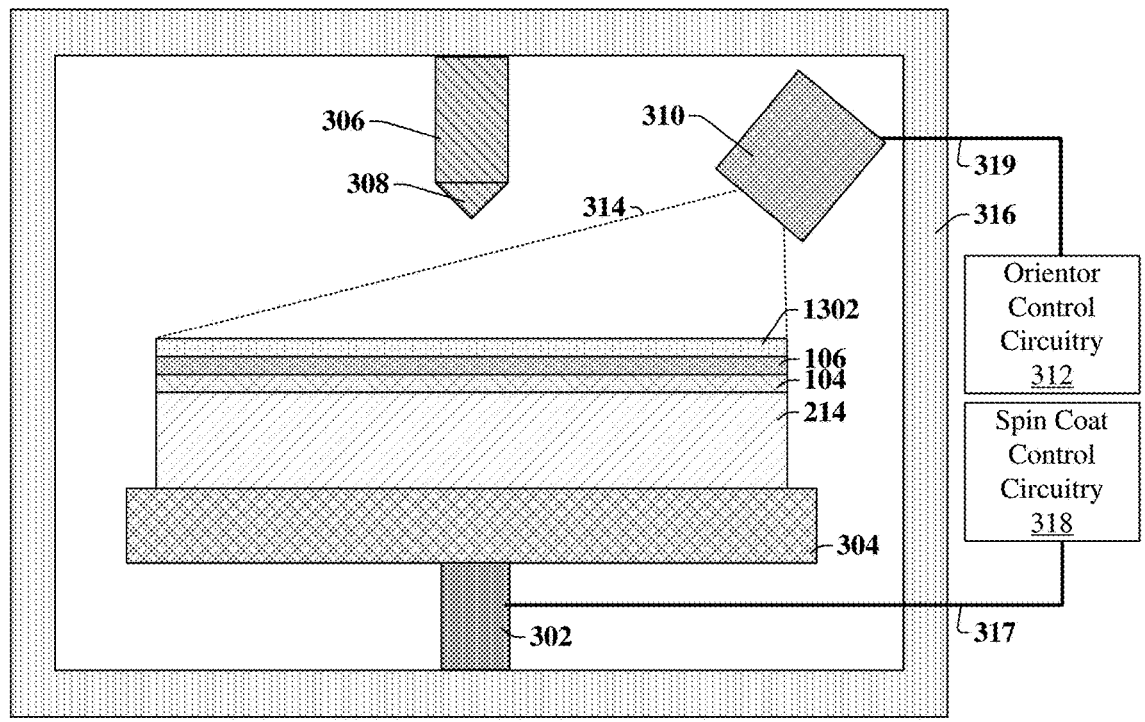
FIGS. 25A-28 illustrate various views of yet some other embodiments of a method of forming a piezoelectric structure over a wafer using a spin-coat tool comprising an orientor device used to form the piezoelectric structure with a small variation in breakdown voltage.

As shown in cross-sectional view 2500A of FIG. 25A, in some embodiments, the orientor device 310 may be arranged within the spin-coat tool housing 316 and over the wafer 214. In some such embodiments, the orientor device 310 may comprise an optical image device and an alignment device arranged within the spin-coat tool housing 316, whereas in other embodiments, one of the optical image device or the alignment device of the orientor device 310 may be arranged outside of the spin-coat tool housing 316. Nevertheless, in some embodiments, after the formation of the sol-gel solution layer 1302 on the bottom electrode 106, the orientor control circuitry 312 may be used to analyze the wafer 214, as illustrated by dotted lines 314, to locate the notch (216 of FIG. 9) of the wafer 214.

Figure 25B:
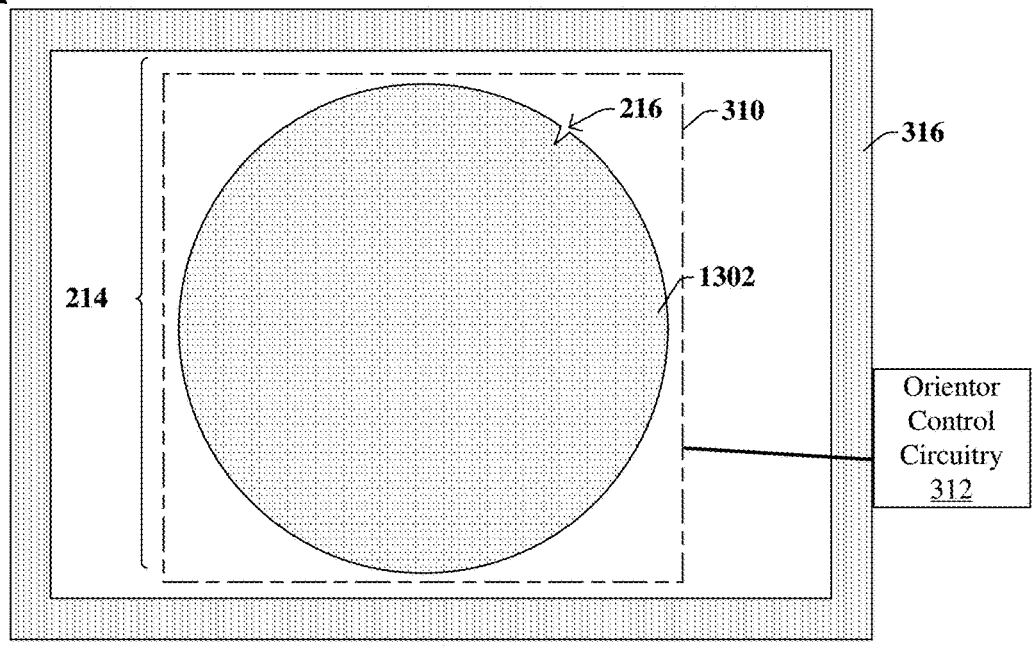

FIG. 25B illustrates a top-view 2500B of some embodiments of the wafer 214 after the spin-coat process. In the top-view 2500B of FIG. 25B, the notch 216 of the wafer 214 may be arranged at some arbitrary locations, and located by the optical image device within the orientor device 310.

Figure 26:
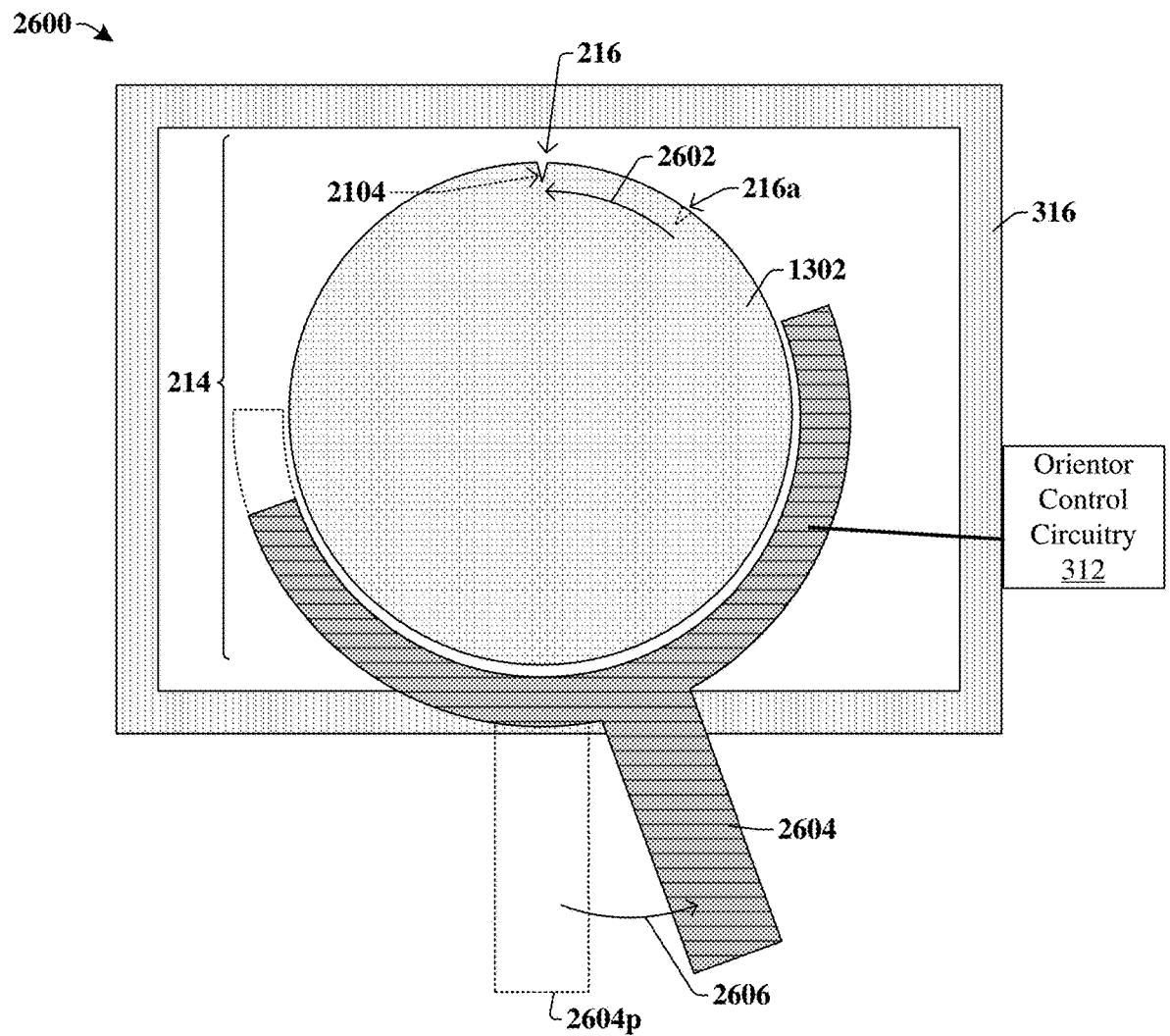

As shown in top-view 2600 of FIG. 26, the orientor control circuitry 312 may be configured to use the alignment device of the orientor device (310 of FIG. 25A) to rotate 2602 the wafer 214 such that the notch 216 is moved from its arbitrary location 216a to a first predetermined position 2104 within the spin-coat tool housing 316. In some embodiments, the alignment device of the orientor device 310 may be or comprise a robotic arm 2604. In such embodiments, the robotic arm 2604 may rotate 2606 from an original position 2604p to orient the wafer 214 such that the notch 216 is arranged at the first predetermined position 2104. In other embodiments, the alignment device of the orientor device 310 may comprise some type of rotation device coupled to the wafer chuck (304 of FIG. 25A), for example. Further, in some embodiments, the alignment device of the orientor device 310, such as the robotic arm 2604 of FIG. 26, may be arranged outside of the spin-coat tool housing 316, and the spin-coat tool housing 316 is opened such that the robotic arm 2604 can rotate 2602 the wafer 214. In some other embodiments, the alignment device of the orientor device 310 may be arranged within the spin-coat tool housing 316.

Figure 27A:
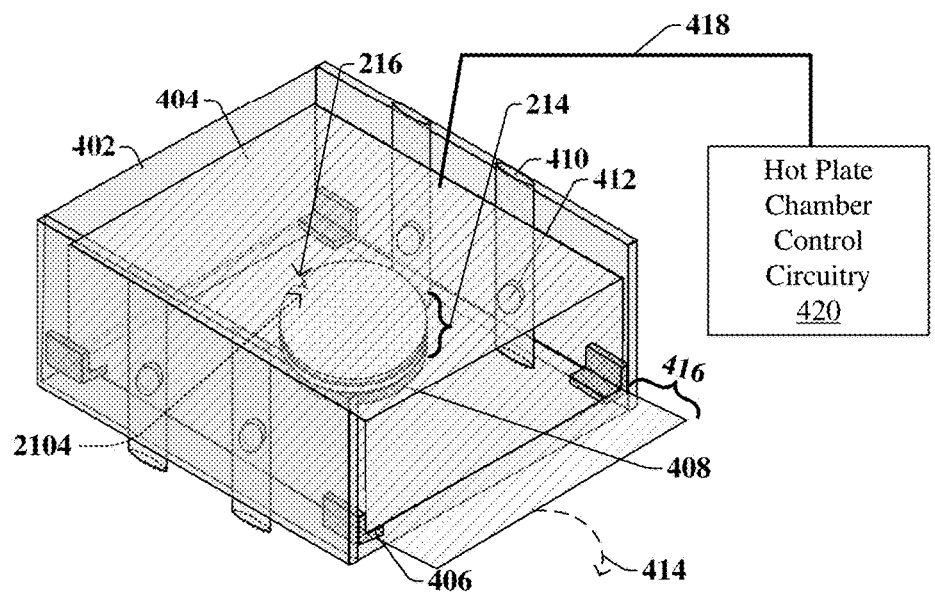

As shown in FIG. 27A, in some embodiments, the alignment device of the orientor device 310 and/or some additional transportation device may be used to transport the wafer 214 from the spin-coat tool housing (316 of FIG. 26) to the hot plate 408 within the hot plate chamber 404. In such embodiments, the alignment device of the orientor device 310 and/or the additional transportation device may maintain the alignment of the wafer 214, such that the notch 216 of the wafer 214 is arranged at the first predetermined position 2104 within the hot plate chamber 404.

In some other embodiments, it will be appreciated that the orientor device 310 may be a separate tool housing unit. For example, in some embodiments, after the spin-coat process, the wafer 214 may be transported into an orientor device housing (not shown), and the orientor device 310 within the orientor device housing may be configured to locate and align the notch 216 of the wafer 214 to be arranged at the first predetermined position 2104. Then, in such other embodiments, the wafer 214 may be transported from the orientor device housing into the hot plate chamber 404 such that the notch 216 of the wafer 214 is arranged at the first predetermined position 2104 within the hot plate chamber 404.

Figure 27B:
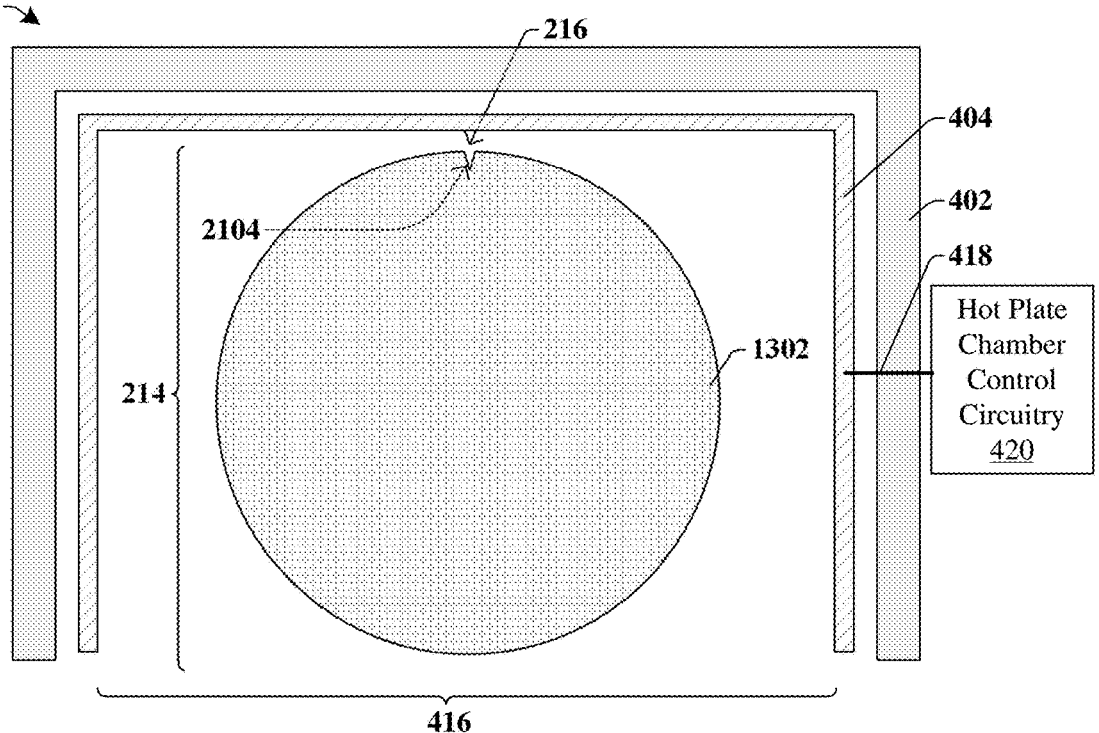

FIG. 27B illustrates a top-view 2700B of some embodiments of the notch 216 of the wafer 214 arranged at the first predetermined position 2104 within the hot plate chamber 404.

As shown in the top-view 2700B, in some embodiments, the first predetermined position 2104 of the notch 216 may be arranged directly across from the door 416 of the hot plate chamber 404. In other embodiments, the first predetermined position 2104 of the notch 216 may be arranged at some other location than what is illustrated in the top-view 2700B of FIG. 27B. Nevertheless, in some embodiments, prior to performing a baking process, the notch 216 of the wafer 214 is arranged at the first predetermined position 2104 within the hot plate chamber 404.

Figure 28:
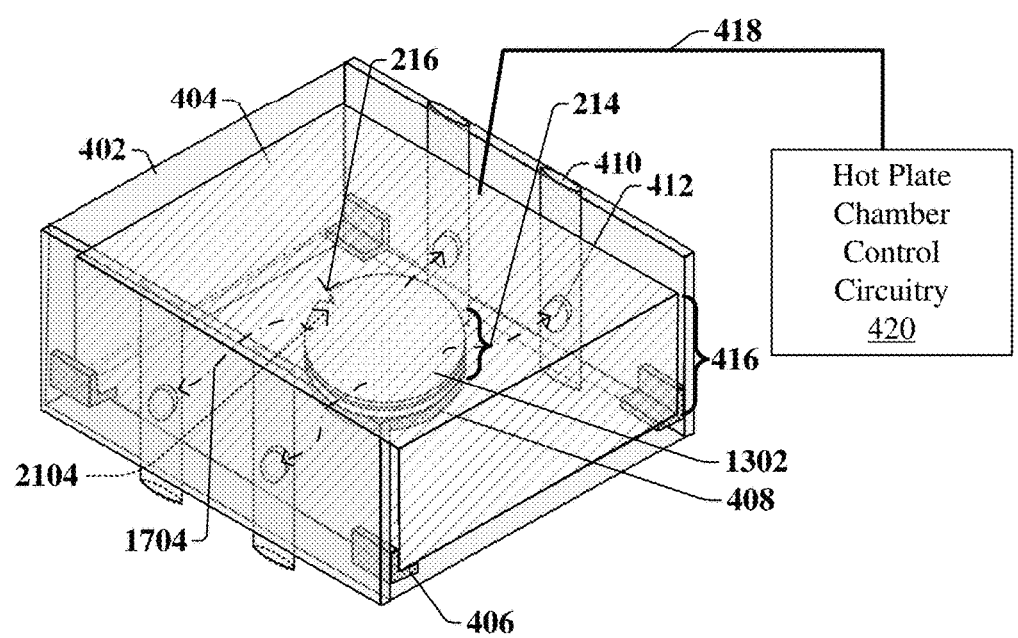

As shown in perspective view 2800 of FIG. 28, in some embodiments, a first cycle of the baking process may be performed in the hot plate chamber 404 when the wafer 214 is arranged at the first predetermined position 2104 within the hot plate chamber 404. In some embodiments, the first cycle of the baking process may comprise the drying step and the decomposition step. In some embodiments, the first cycle of the baking process completely dries, decomposes, and densifies the sol-gel solution layer 1302 to form a first piezoelectric layer (108*a* of FIG. 17). In such embodiments, the wafer 214 may remain stationary during the first cycle of the baking process conducted at the first predetermined position 2104 within the hot plate chamber 404.

In some embodiments, the method of FIGS. 10-13 and FIGS. 25A-28 is repeated to form multiple piezoelectric layers (e.g., the first through fourth piezoelectric layers 108*a*-*d* of FIG. 18) over the wafer, wherein each piezoelectric layer (e.g., 108*a*-*d* of FIG. 18) undergoes a cycle of the baking process at a different predetermined location within the hot plate chamber 404. For example, in some embodiments, the method of FIGS. 10-13 and FIGS. 25A-28 are repeated to form a second sol-gel solution layer over the first piezoelectric layer (108*a* of FIG. 17). Then, the orientor device 310 arranged within or outside of the spin-coat tool housing (316 of FIG. 25A) is used to orient the notch 216 of the wafer 214 to be located at a second predetermined location (e.g., 2306 of FIG. 23). In such embodiments, a second cycle of the baking process is then performed when the notch 216 of the wafer 214 is arranged at the second predetermined position 2306 within the hot plate chamber 404. In some such embodiments, the second cycle of the baking process may be completely dry, decompose, and densify the second sol-gel solution layer to form a second piezoelectric layer (108*b* of FIG. 18) over the first piezoelectric layer (108*a* of FIG. 18). In some such embodiments, the method of FIGS. 10-13 and FIGS. 25A-28 are repeated a third time to form a third piezoelectric layer (108*c* of FIG. 18) at a third predetermined position (2308 of FIG. 23), are repeated a fourth time to form a fourth piezoelectric layer (108*d* of FIG. 18) at a fourth predetermined position (2310 of FIG. 23), and so on.

In such embodiments, the overall piezoelectric structure (108 of FIG. 18) may have a reduced variation in composition and thus, properties (e.g., breakdown voltage) because the baking process is performed at different orientations within the hot plate chamber 404. However, in such embodiments, wherein the method of FIGS. 10-13 and FIGS. 25A-28 are used to form a piezoelectric layer, each piezoelectric layer (108*a*-*d* of FIG. 18) may have a varying composition and varying properties (e.g., breakdown voltage) throughout each piezoelectric layer because the wafer 214 was not rotated throughout each the baking process as shown in the method of FIGS. 15 and 16 or FIGS. 20A-23, for example. Nevertheless, by forming the piezoelectric layers (e.g., 108*a*-*d* of FIG. 18) at different orientations (e.g., the first predetermined position 2104, the second predetermined position 2306, the third predetermined position 2308, the fourth predetermined position 2310 of FIG. 23) within the hot plate chamber 404 as in FIGS. 10-13 and 25A-28, the overall piezoelectric structure (108 of FIG. 18) may have a reduced variation in composition and thus, properties (e.g., breakdown voltage).

Figure 29:
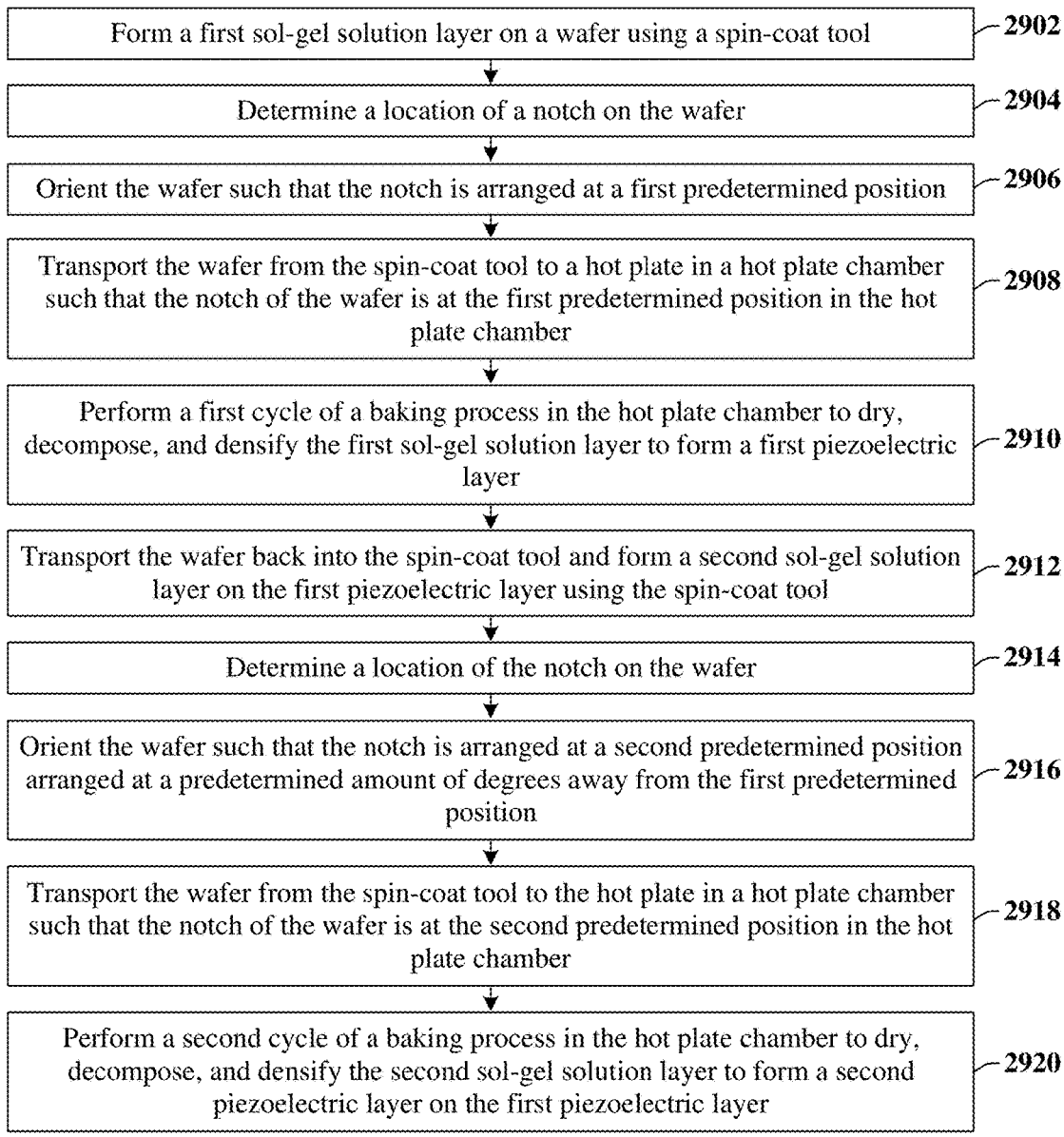
FIG. 29 illustrates a flow diagram of some embodiments corresponding to the method of FIGS. 25A-28.

FIG. 29 illustrates a flow diagram of some embodiments of a method 2900 corresponding to FIGS. 25A-28.

While method 2900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2902, a first sol-gel solution layer is formed on a wafer using a spin-coat tool. FIGS. 11-13 illustrate cross-sectional views 1100-1300, respectively, of some embodiments corresponding to act 2902.

At act 2904, a location of a notch on the wafer is determined. FIGS. 25A and 25B illustrate cross-sectional view 2500A and top-view 2500B of some embodiments corresponding to act 2904.

At act 2906, the wafer is oriented such that the notch is arranged at a first predetermined position. FIG. 26 illustrates a top-view 2600 of some embodiments corresponding to act 2906.

At act 2908, the wafer is transported from the spin-coat tool to a hot plate in a hot plate chamber such that the notch of the wafer is at the first predetermined position in the hot plate chamber. FIG. 27A illustrates a perspective view 2700A of some embodiments corresponding to act 2908.

At act 2910, a first cycle of a baking process is performed in the hot plate chamber to dry, decompose, and densify the first sol-gel solution layer to form a first piezoelectric layer. FIG. 28 illustrates a perspective view 2800 of some embodiments corresponding to act 2910.

At act 2912, the wafer is transported back into the spin-coat tool, and a second sol-gel solution layer is formed on the first piezoelectric layer using the spin-coat tool. FIGS. 11-13 illustrate cross-sectional views 1100-1300, respectively, of some embodiments corresponding to act 2912.

At act 2914, a location of the notch on the wafer is determined. FIGS. 25A and 25B illustrate cross-sectional view 2500A and top-view 2500B of some embodiments corresponding to act 2914.

At act 2916, the wafer is oriented such that the notch of the wafer is arranged at a second predetermined location which is arranged at a predetermined amount of degrees away from the first predetermined position. FIG. 26 illustrates a top-view 2600 of some embodiments corresponding to act 2916.

At act 2918, the wafer is transported from the spin-coat tool to a hot plate in a hot plate chamber such that the notch of the wafer is at the second predetermined position in the hot plate chamber. FIG. 27A illustrates a perspective view 2700A of some embodiments corresponding to act 2918.

At act 2920, a second cycle of a baking process is performed in the hot plate chamber to dry, decompose, and densify the second sol-gel solution layer to form a second piezoelectric layer on the first piezoelectric layer. FIG. 28 illustrates a perspective view 2800 of some embodiments corresponding to act 2920.

Figure 30:
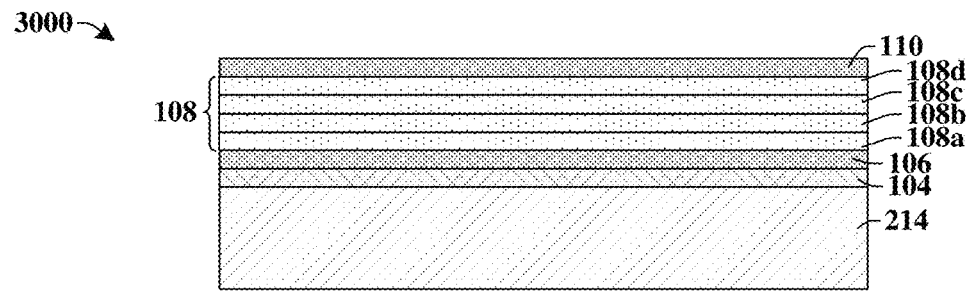
FIGS. 30-32 illustrate various views of some embodiments of forming a top electrode over a piezoelectric structure on a wafer to form multiple piezoelectric devices.
Figure 31:
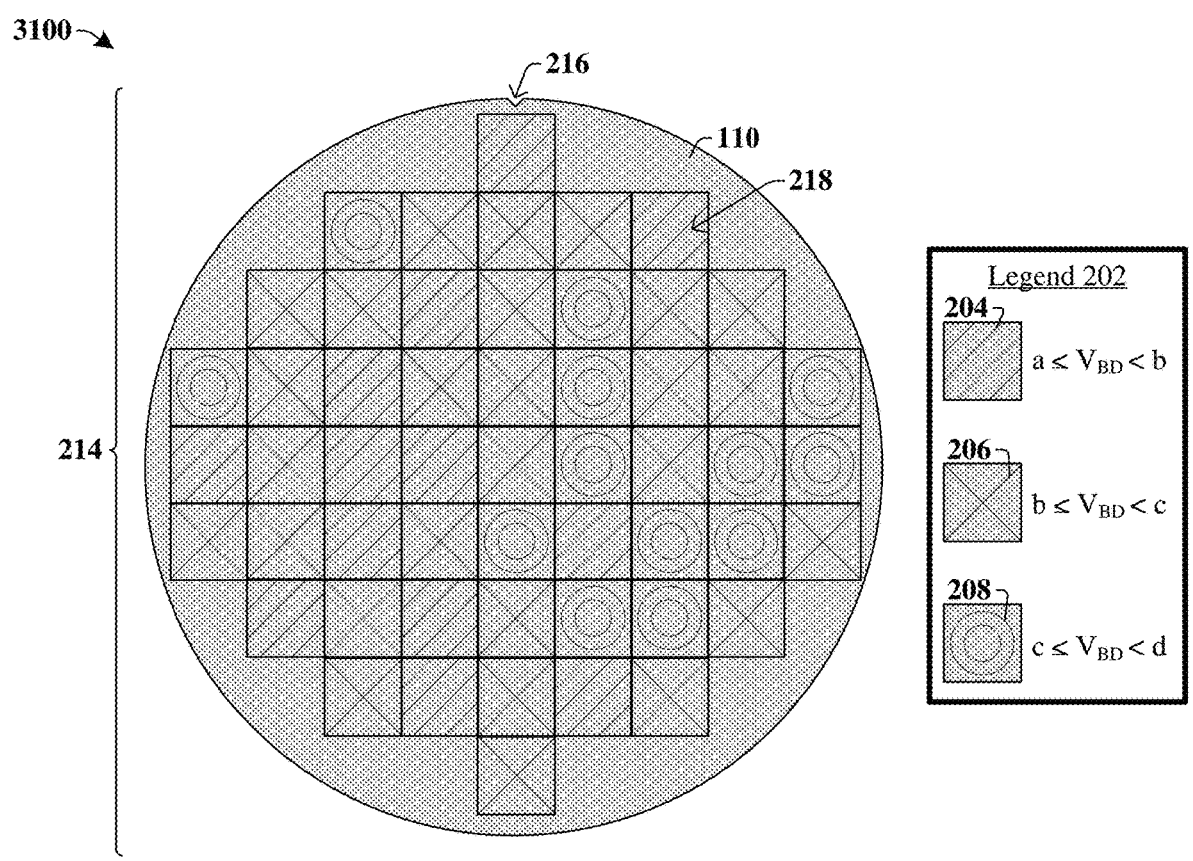
Figure 32:
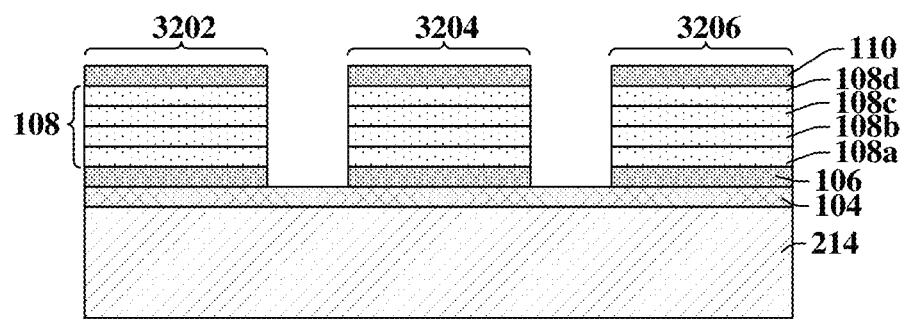

FIGS. 30-32 illustrate various views 3000-3200 of some embodiments of a method of forming piezoelectric devices from a piezoelectric structure formed on a wafer, wherein the wafer is arranged at different orientations during a baking process to form the piezoelectric structure. Although FIGS. 30-32 are described in relation to a method, it will be appreciated that the structures disclosed in FIGS. 30-32 are not limited to such a method, but instead may stand alone as structures independent of the method.

As shown in cross-sectional view 3000 of FIG. 30, after the first through fourth piezoelectric layers 108a-d are formed over the wafer, a top electrode 110 may be formed over the piezoelectric structure 108. In some embodiments, the top electrode 110 is formed directly on the piezoelectric structure 108. In some embodiments, the top electrode 110 may comprise, for example, copper, platinum, gold, silver, titanium, cobalt, titanium nitride, manganese, zinc, or some other suitable conductive material. In some embodiments, the top electrode 110 may be formed by way of a deposition process (e.g., PVD, CVD, PE-CVD, ALD, sputtering, etc.).

As shown in top-view 3100 of FIG. 31, in some embodiments, the wafer 214 comprises multiple die regions 218, and a dicing process that utilizes a rotating blade and/or water will separate each die region 218 to form multiple piezoelectric devices.

The top-view 3100 of FIG. 31, like the top-view 200 of FIG. 2, illustrates that each die region 218 may correspond to a piezoelectric device having a breakdown voltage that corresponds to a low breakdown voltage 204, a mid-breakdown voltage 206, or a high breakdown voltage 208 as indicated by a diagonal-stripe pattern, a cross pattern, or a concentric-circle pattern, respectively.

In some embodiments, an overall variation in the breakdown voltages throughout the piezoelectric structure (108 of FIG. 30) on the wafer 214 may be quantified by a range of between a and d. The reliability of the piezoelectric structure (108 of FIG. 30) may be increased by reducing the range between a and d such that the piezoelectric structure (108 of FIG. 30) may be formed with a more uniform, and thus, predictable breakdown voltage for each die region 218. This way, each piezoelectric device has a known breakdown voltage such that the control circuitry (112 of FIG. 1) does not apply a voltage bias across the piezoelectric structure (108 of FIG. 30) in a piezoelectric device that exceeds the known breakdown voltage and irreversibly damage the piezoelectric structure (108 of FIG. 30). In some embodiments, reducing the range between a and d for the breakdown voltage of the piezoelectric structure (108 of FIG. 30) is achieved by rotating the wafer 214 during the baking process of a sol-gel process used to form the piezoelectric structure (108 of FIG. 30) which may be achieved by, for example, the methods illustrated in FIGS. 14-18, FIGS. 20A-23, or FIGS. 25A-28.

As shown in cross-sectional view 3200 of FIG. 32, in some embodiments, a removal process may be performed to form a first piezoelectric device 3202, a second piezoelectric device 3204, and a third piezoelectric device 3206 over the wafer 214. In some embodiments, the removal process may remove portions of the bottom electrode 106, the piezoelectric structure 108, and the top electrode 110 by way of photolithography and removal processes. In other embodiments, the removal process may comprise a dicing process that utilizes a blade and/or water to completely separate the first, second, and third piezoelectric devices 3202, 3204, 3206 from one another and thereby removing/cutting through portions of the passivation layer 104 and the wafer 214. Nevertheless, in such embodiments, variation between the breakdown voltages of the first, second, and third piezoelectric devices 3202, 3204, 3206 is reduced (e.g., less than 10 volts) because the piezoelectric structure 108 was formed by rotating the wafer 214 throughout a baking process used to form the piezoelectric structure 108. By having a reduced variation in breakdown voltage (e.g., less than 10 volts), each of the first, second, and third piezoelectric devices 3202, 3204, 3206 are more reliable.

Figure 33:
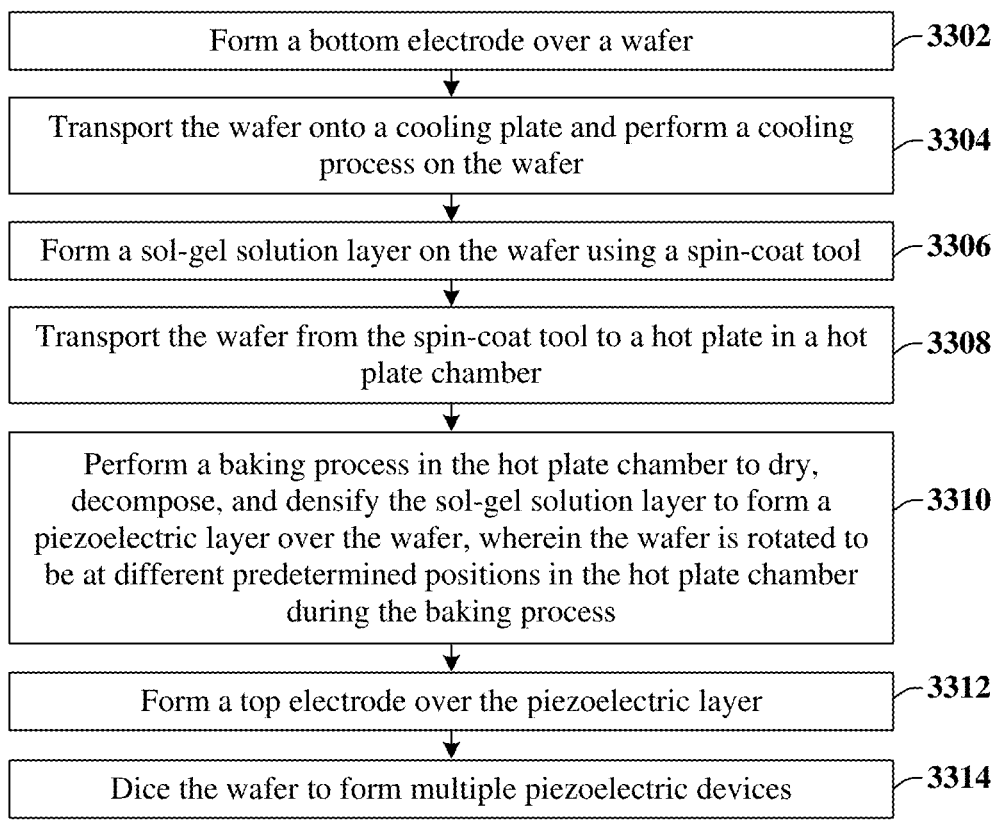
FIG. 33 illustrates a flow diagram of some embodiments of a method of forming piezoelectric devices by rotating a wafer during a baking process to form a piezoelectric structure in order to reduce variation breakdown voltages of the piezoelectric structures in the piezoelectric devices.

FIG. 33 illustrates a flow diagram of some embodiments of a method 3300 of forming a piezoelectric device from a piezoelectric structure formed on a wafer by a sol-gel process, wherein the wafer is arranged at different orientations during a baking process of the sol-gel process to reduce variation in breakdown voltages amongst resulting piezoelectric devices.

While method 3300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 3302, a bottom electrode is formed over a wafer. FIG. 8 illustrates cross-sectional view 800 of some embodiments corresponding to act 3302.

At act 3304, the wafer is transported onto a cooling plate and a cooling process is performed on the wafer. FIG. 10 illustrates cross-sectional view 1000 of some embodiments corresponding to act 3304.

At act 3306, a sol-gel solution layer is formed on the wafer using a spin-coat tool. FIGS. 11-13 illustrate cross-sectional views 1100-1300, respectively, of some embodiments corresponding to act 3306.

At act 3308, the wafer is transported from the spin-coat tool to a hot plate in a hot plate chamber. FIG. 14 illustrates perspective view 1400 of some embodiments corresponding to act 3308.

At act 3310, a baking process is performed in the hot plate chamber to dry, decompose and densify the sol-gel solution layer to form a piezoelectric layer over the wafer, wherein the wafer is rotated to be at different predetermined positions in the hot plate chamber during the baking process. FIGS. 15 and 16 illustrates cross-sectional view 1500 and top-view 1600, respectively, of some embodiments corresponding to act 3310.

At act 3312, a top electrode is formed over the piezoelectric layer. FIG. 30 illustrates cross-sectional view 3000 of some embodiments corresponding to act 3312.

At act 3314, the wafer is diced to form multiple piezoelectric devices. FIG. 32 illustrates cross-sectional view 3200 of some embodiments corresponding to act 3314.

Therefore, the present disclosure relates to a method of forming a piezoelectric structure by forming the piezoelectric layers of the piezoelectric structure at different orientations within a hot plate chamber throughout a baking process to reduce variation in composition and thus, properties (e.g., breakdown voltage) of the piezoelectric structure to ultimately form reliable piezoelectric devices.

Accordingly, in some embodiments, the present disclosure relates to a processing tool, comprising: a wafer chuck disposed within a hot plate chamber and having an upper surface configured to hold a semiconductor wafer; a heating element disposed within the wafer chuck and configured to increase a temperature of the wafer chuck; a motor coupled to the wafer chuck and configured to rotate the wafer chuck around an axis of rotation extending through the upper surface of the wafer chuck; and control circuitry coupled to the motor and configured to operate the motor to rotate the wafer chuck while the temperature of the wafer chuck is increased to form a piezoelectric layer from a sol-gel solution layer on the semiconductor wafer.

In other embodiments, the present disclosure relates to a method comprising: forming a bottom electrode on a wafer; transporting the wafer onto a cooling plate and performing a cooling process on the wafer; forming a first sol-gel solution layer on the wafer using a spin-coat tool; transporting the wafer from the spin-coat tool to a hot plate in a hot plate chamber; performing a baking process in the hot plate chamber to dry the first sol-gel solution layer to form a first piezoelectric layer from the first sol-gel solution layer; forming a top electrode over the first piezoelectric layer; and dicing the wafer to form multiple piezoelectric devices from the wafer, wherein the wafer is arranged at different orientations with respect to the hot plate chamber throughout the baking process.

In yet other embodiments, the present disclosure relates to a method comprising: forming a bottom electrode on a wafer; forming a first piezoelectric layer on the bottom electrode using a sol-gel process, wherein the sol-gel process comprises: forming a first sol-gel solution layer on the wafer using a spin-coat tool, transporting the wafer from the spin-coat tool to a hot plate in a hot plate chamber, and performing a baking process in the hot plate chamber to dry, decompose, and densify the first sol-gel solution layer to form the first piezoelectric layer on the bottom electrode, wherein the wafer is rotated within the hot plate chamber during the baking process; forming a top electrode over the first piezoelectric layer; and forming multiple piezoelectric devices from the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a bottom electrode on a substrate;
   forming a first piezoelectric layer on the bottom electrode using a sol-gel process, wherein the sol-gel process comprises:
      spin coating a first sol-gel solution layer on the substrate,
      providing the substrate to a hot plate in a hot plate chamber after the first sol-gel solution layer is on the substrate,
      performing a baking process in the hot plate chamber to dry, decompose, and densify the first sol-gel solution layer to form the first piezoelectric layer on the bottom electrode,
      identifying a location of a notch on the substrate when the substrate is in the hot plate chamber, and
      rotating the substrate within the hot plate chamber so that the notch moves along a closed circular path while being exposed to the baking process; and
   forming a top electrode over the first piezoelectric layer; and
   forming multiple piezoelectric devices from the substrate.

2. The method of claim 1, wherein the substrate is arranged at different orientations with respect to the hot plate chamber throughout the baking process by continuously rotating the hot plate during the baking process.

3. The method of claim 1, further comprising:
   transporting the substrate onto a cooling plate and performing a cooling process on the substrate prior to spin coating the first sol-gel solution layer on the substrate.

4. The method of claim 1, further comprising:
   orienting the substrate such that the notch is arranged at different stationary positions within the hot plate chamber during different cycles of the baking process.

5. The method of claim 4, wherein the different stationary positions are approximately 90 degrees apart from one another.

6. The method of claim 1, further comprising:
   spin coating the first sol-gel solution layer on the substrate within a spin-coating tool;
   identifying the notch on the substrate using an orientor device when the substrate is in the spin-coating tool;
   orienting the substrate such that the notch is arranged at a first predetermined orientation;

maintaining the substrate at the first predetermined orientation while transporting the substrate from the spin-coating tool to the hot plate in the hot plate chamber; and performing a first cycle of the baking process when the substrate is at the first predetermined orientation to form the first piezoelectric layer from the first sol-gel solution layer.

7. The method of claim 1, further comprising:
spin coating a second sol-gel solution layer on the first piezoelectric layer within a spin-coating tool;
providing the substrate to the hot plate in the hot plate chamber after the second sol-gel solution layer is on the first piezoelectric layer;
performing a second baking process in the hot plate chamber to dry, decompose, and densify the second sol-gel solution layer to form a second piezoelectric layer on the first piezoelectric layer, wherein the substrate is rotated within the hot plate chamber during the second baking process; and
forming the top electrode over the second piezoelectric layer.

8. The method of claim 7, further comprising:
transporting the substrate back into the spin-coating tool after the baking process is completed;
forming the second sol-gel solution layer on the first piezoelectric layer;
identifying the notch using an orientor device within the spin-coating tool;
orienting the substrate such that the notch is arranged at a second predetermined position;
transporting the substrate from the spin-coating tool to the hot plate in the hot plate chamber while maintaining the substrate at the second predetermined position; and
performing a second cycle of the baking process when the substrate is at the second predetermined position to form the second piezoelectric layer from the second sol-gel solution layer.

9. The method of claim 1, wherein a difference between a minimum breakdown voltage of the multiple piezoelectric devices and a maximum breakdown voltage of the multiple piezoelectric devices is in a range of between approximately 8 volts and approximately 10 volts.

10. A method comprising:
forming a bottom electrode on a substrate;
forming a first piezoelectric layer on the bottom electrode using a sol-gel process, wherein the sol-gel process comprises:
spin coating a first sol-gel solution layer on the substrate,
providing the substrate to a hot plate in a hot plate chamber after the first sol-gel solution layer is on the substrate,
performing a baking process in the hot plate chamber to dry, decompose, and densify the first sol-gel solution layer to form the first piezoelectric layer on the bottom electrode,
identifying a location of a notch on the substrate when the substrate is in the hot plate chamber, and
rotating the substrate over multiple full 360-degree rotations within the hot plate chamber so that the notch moves along a closed circular path while being exposed to the baking process;
forming a top electrode directly onto the first piezoelectric layer; and
forming multiple piezoelectric devices from the substrate.

11. The method of claim 10, wherein the substrate is rotated continuously within the hot plate chamber during the baking process.

12. The method of claim 10, wherein each of the multiple piezoelectric devices has a breakdown voltage, and wherein a difference between a minimum breakdown voltage of the multiple piezoelectric devices and a maximum breakdown voltage of the multiple piezoelectric devices is at most equal to 10 volts.

13. The method of claim 10, wherein the baking process comprises multiple cycles, wherein the substrate is rotated between each of the multiple cycles, and wherein the substrate is stationary during each of the multiple cycles of the baking process.

14. The method of claim 13, wherein the substrate is rotated by 90 degrees between each of the multiple cycles of the baking process, and wherein the baking process comprises four cycles.

15. The method of claim 13, wherein the substrate is rotated using an orientor device arranged within the hot plate chamber, and wherein the orientor device comprises an optical image device and an alignment device.

16. The method of claim 13, wherein each of the multiple cycles of the baking process comprises a drying step at a first temperature and a gel decomposition step at a second temperature greater than the first temperature.

17. A method comprising:
forming a bottom electrode on a substrate;
forming a first piezoelectric layer on the bottom electrode using a sol-gel process, wherein the sol-gel process comprises:
spin coating a first sol-gel solution layer on the substrate,
providing the substrate to a hot plate in a hot plate chamber after the first sol-gel solution layer is on the substrate,
performing a baking process in the hot plate chamber to dry, decompose, and densify the first sol-gel solution layer to form the first piezoelectric layer on the bottom electrode, wherein the baking process comprises a drying step at a first temperature and a gel decomposition step at a second temperature greater than the first temperature,
identifying a location of a notch on the substrate when the substrate is in the hot plate chamber, and
rotating the substrate within the hot plate chamber so that the notch moves along a closed circular path while being exposed to the baking process;
forming a top electrode over the first piezoelectric layer; and
forming multiple piezoelectric devices from the substrate.

18. The method of claim 17, further comprising:
rotating the substrate such that the notch is in a first predetermined position with respect to the hot plate chamber during a first cycle of the baking process; and
rotating the substrate by a predetermined amount of degrees to a second predetermined position, during a second cycle of the baking process that is separate from the first cycle of the baking process.

19. The method of claim 17, wherein the baking process comprises a first cycle that includes performing the drying step at the first temperature and performing the gel decomposition step at the second temperature.

20. The method of claim 19, wherein the baking process further comprises a second cycle comprising one or more same parameters as the first cycle of the baking process.

* * * * *